(12) United States Patent
Gopinath et al.

(10) Patent No.: US 12,159,685 B2
(45) Date of Patent: Dec. 3, 2024

(54) PARTITIONED MEMORY ARCHITECTURE AND METHOD FOR REPEATEDLY USING THE ARCHITECTURE FOR MULTIPLE IN-MEMORY PROCESSING LAYERS

(71) Applicant: GlobalFoundries U.S. Inc., Malta, NY (US)

(72) Inventors: Venkatesh P. Gopinath, Fremont, CA (US); Pirooz Parvarandeh, Los Altos Hills, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 116 days.

(21) Appl. No.: 18/045,545

(22) Filed: Oct. 11, 2022

(65) Prior Publication Data
US 2024/0119975 A1      Apr. 11, 2024

(51) Int. Cl.
*G11C 7/10*      (2006.01)
(52) U.S. Cl.
CPC .......... *G11C 7/1039* (2013.01); *G11C 7/1012* (2013.01); *G11C 7/1084* (2013.01); *G11C 7/1096* (2013.01)
(58) Field of Classification Search
CPC ... G11C 7/1039; G11C 7/1012; G11C 7/1084; G11C 7/1096; G11C 27/026;
(Continued)

(56) References Cited

U.S. PATENT DOCUMENTS

| 4,906,865 A | 3/1990 | Holler |
| 7,830,705 B2 | 11/2010 | Jeong |

(Continued)

FOREIGN PATENT DOCUMENTS

| CN | 113139641 A | 7/2021 |
| DE | 102020126502 A1 | 5/2021 |

(Continued)

OTHER PUBLICATIONS

Aziza et al., "Multi-Level Control of Resistive RAM (RRAM) Using a Write Termination to Achieve 4 Bits/Cell in High Resistance State," Electronics 2021, 10, 2222, 15 pages.

(Continued)

*Primary Examiner* — Ajay Ojha
(74) *Attorney, Agent, or Firm* — David Cain; Hoffman Warnick LLC

(57) ABSTRACT

A structure for in-memory processing includes memory banks arranged in columns and rows, each bank having bank input nodes, at least one bitline, and cells arranged in a column and connected to corresponding bank input nodes, respectively, and to the bitline(s). Each cell includes layer-specific memory elements, which are individually programmable to store layer-specific weight values and individually connectable (e.g., by switches) to the corresponding bank input node and the bitline(s). The initial memory banks in each row also include track-and-hold devices (THs) connected to the bank input nodes. For each iteration of in-memory processing, the outputs from one processing layer are feedback to pre-designated THs for use as inputs for the next processing layer, the appropriate layer-specific memory elements in the cells are connected to the corresponding bank input nodes and bitline(s), and output(s) for the next processing layer are generated.

20 Claims, 12 Drawing Sheets

(58) Field of Classification Search
CPC ....... G11C 2213/77; G11C 7/12; G11C 11/54; G11C 11/56; G11C 13/0004; G11C 13/0026; G11C 13/0028; G11C 13/003; G11C 13/004; G11C 7/1006; G06N 3/045; G06N 3/065; G06F 7/5443

See application file for complete search history.

(56) References Cited

U.S. PATENT DOCUMENTS

| | | |
|---|---|---|
| 9,450,021 B1 | 9/2016 | Lee |
| 9,934,838 B1 | 4/2018 | Han et al. |
| 10,290,679 B1 | 5/2019 | Bhushan et al. |
| 11,335,401 B1 | 5/2022 | Huang et al. |
| 11,393,512 B2 | 7/2022 | Lai et al. |
| 2006/0067106 A1 | 3/2006 | Mori et al. |
| 2006/0126413 A1 | 6/2006 | Liaw |
| 2014/0050020 A1 | 2/2014 | Lee et al. |
| 2014/0169068 A1 | 6/2014 | Lee et al. |
| 2016/0027488 A1 | 1/2016 | Kim |
| 2016/0372187 A1 | 12/2016 | Papandreou et al. |
| 2018/0260696 A1* | 9/2018 | Suda ............... G11C 13/0002 |
| 2018/0268898 A1 | 9/2018 | Suzuki et al. |
| 2019/0147330 A1 | 5/2019 | Otsuka et al. |
| 2019/0236445 A1 | 8/2019 | Das et al. |
| 2019/0392896 A1 | 12/2019 | Chung |
| 2020/0356848 A1 | 11/2020 | Lesso et al. |
| 2021/0064379 A1* | 3/2021 | Mattina ............... G06F 7/5443 |
| 2021/0263683 A1 | 8/2021 | Bayat et al. |
| 2023/0066707 A1 | 3/2023 | Chuang |
| 2023/0326524 A1 | 10/2023 | Pasotti et al. |
| 2023/0326525 A1 | 10/2023 | Akarvardar et al. |
| 2024/0038300 A1 | 2/2024 | Kumar et al. |

FOREIGN PATENT DOCUMENTS

| | | |
|---|---|---|
| WO | 2018069716 A1 | 4/2018 |
| WO | 2020243300 A1 | 12/2020 |

OTHER PUBLICATIONS

Dong et al., "Design Considerations of Large-Scale RRAM-Based Convolutional Neural Networks with Transfer Learning," retrieved from https://www.researchgate.net/publication/343982199, uploaded Aug. 30, 2020, 7 pages.

Fick et al., "Analog In-Memory Subthreshold Deep Neural Network Accelerator," IEEE 2017, 4 pages.

Giannoula et al., "SparseP: Towards Efficient Sparse Matrix Vector Multiplication on Real Processing-In-Memory Systems," arXiv:2201.05072v4 [cs.AR], May 23, 2022, 60 pages.

Gu et al., "Technilogical Exploration of RRAM Crossbar Array for Matrix-Vector Multiplication," IEEE 2015, pp. 106-111.

Jaiswal et al., "8T SRAM Cell as a Multi-bit Dot Product Engine for Beyond von-Neumann Computing," IEEE Oct. 16, 2018, 10 pages.

Qiao et al., "AtomLayer: A universal ReRAM-based CNN accelerator with atomic layer computation," In Proceedings of the 55th Annual Design Automation Conference 6 pages.

Sahay et al., A 2T-1R Cell Array with High Dynamic Range for Mismatch-Robust and Efficient Neurocomputing, IEEE 2020, 4 pages.

Shafiee et al., "ISAAC: A convolutional neural network accelerator with in-situ analog arithmetic in crossbars," ACM SIGARCH Computer Architecture News, 44(3), pp. 14-26.

Stathopoulos et al., "Multibit memory operation of metal oxide bi-layer memristors," Scientific Reports 7.1 (2017), 7 pages.

Xue et al., "Embedded 1-Mb ReRAM-Based Computing-in-Memory Macro With Multibit Input and weight for CNN-Baed AI Edge Processors," IEEE Journal of Solid-State Circuits, vol. 55, No. 1, Jan. 2020, pp. 203-215.

Yao et al., "Fully hardware-implemented memristor convolutional neural network," Nature, vol. 577, Jan. 30, 2020, pp. 641-662.

Yin et al., "Monolithically Integrated RRAM-and CMOS-Based In-Memory Computing Optimizations for Efficient Deep Learning," IEEE Mirco 2019, pp. 54-63.

Correll et al., "A Fully Integrated Reprogrammable CMOS-RRAM Compute-in-Memory Coprocessor for Neuromorphic Applications," IEEE Journal on Exploratory Solid-State Computational Devices and Circuits, published May 4, 2020, pp. 36-44.

European Search Report for EP Application No. 23187989.1-1211 dated Mar. 5, 2024, 9 pages (corresponding to U.S. Appl. No. 18/045,545).

Chang et al., "AI hardware acceleration with analog memory: Microarchitectures for low energy at high speed," IBM J. Res. & Dev. vol. 63, No. 6, Paper 8, Nov./Dec. 2019, 14 pages.

European Search Report for EP Application No. 23187147.6-1211 dated Mar. 6, 2024, 11 pages (corresponding to U.S. Appl. No. 18/045,524).

European Search Report for EP Application No. 231879933-1211 dated Mar. 13, 2024, 9 pages (corresponding to U.S. Appl. No. 18/045,479).

U.S. Appl. No. 18/045,524, Office Action dated Jun. 11, 2024, 17 pages.

EP Patent Application Serial No. 23187997.4-1211, Search Report dated Jul. 24, 2024, 9 pages.

U.S. Appl. No. 18/045,520, Office Action dated Jul. 22, 2024, 13 pages.

U.S. Appl. No. 18/045,479, Notice of Allowance dated Jun. 28, 2024, 28 pages.

U.S. Appl. No. 18/045,529, Notice of Allowance dated Jul. 31, 2024, 12 pages.

U.S. Appl. No. 18/045,524, Response to Office Action filed Jun. 24, 2024, 11 pages.

U.S. Appl. No. 18/045,520, Notice of Allowance dated Oct. 17, 2024, 11 pages.

* cited by examiner

PARTITIONED MEMORY ARCHITECTURE AND METHOD FOR REPEATEDLY USING THE ARCHITECTURE FOR MULTIPLE IN-MEMORY PROCESSING LAYERS

BACKGROUND

Field of the Invention

The present invention relates to in-memory processing and, more particularly, to a memory architecture for in-memory processing and operating method.

Description of Related Art

Various processing applications (e.g., image processing applications, voice processing applications, or other machine learning (ML) or artificial intelligence (AI) processing) employ cognitive computing and, particularly, neural networks (NNs) (e.g., for recognition and classification). Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. Recently, processors with hardware-implemented NN's and, particularly, with memory-implemented NN's have been developed to increase processing speed. However, such memory implemented NNs typically require large memory cell arrays (i.e., arrays with a large number of rows and columns of memory cells) to implement and, as the complexity of such NNs increases, so does the size of the arrays. Unfortunately, such an increase in array size can result in an increase in local voltage ("IR") drops across the array, thereby leading to processing errors. Additionally, designers have to balance the need for increased through put over the need for reduced area consumption.

SUMMARY

Embodiments of a disclosed structure can include an array of memory arranged in rows and columns. Each memory bank can include bank input nodes, a bitline, and multiple cells arranged in a single column and connected to the bank input nodes, respectively, and to the bitline. Each cell can include a cell input node connected to a corresponding bank input node and a cell output node connected to the bitline. Each cell can further include multiple switches and multiple memory elements and, particularly, multiple individually selectable single resistor memory elements. Specifically, each memory element can include a single programmable resistor with opposing end terminals connectable by a corresponding pair of the switches to the cell input node (and thereby to the corresponding bank input node) and the cell output node (and thereby to the bitline). Additionally, in the array of memory banks, each row of memory banks will include an initial memory bank (i.e., the first memory bank in the row) and that initial memory bank can include amplifiers connected between the bank input nodes and the cells and track-and-hold devices (THs) connected to the bank input nodes. When such a structure is employed for in-memory processing, these THs and the individually selectable memory elements in each cell facilitate structure reuse (also referred to herein as fabric reuse) wherein the outputs generated by the structure for one processing layer in a series of processing layers can be fed back into the same structure as the inputs for the next processing layer.

Other embodiments of a disclosed structure can include an array of memory banks arranged in rows and columns. Each memory bank can include bank input nodes, a first bitline, a second bitline, and multiple cells arranged in a single column and connected to the bank input nodes, respectively, and to both the first bitline and the second bitline. Each cell can include a first cell input node connected to a corresponding bank input node, a first cell output node connected to the first bitline, a second cell input node connected to the corresponding bank input node, and a second cell output node connected to the second bitline. Each cell can further include first switches, second switches, and multiple memory elements and, particularly, multiple individually selectable dual resistor memory elements. Specifically, each memory element can include a first programmable resistor and a second programmable resistor. The first programmable resistor can have first opposing end terminals connectable by a first switch to the first cell input node (and thereby to the corresponding bank input node) and further connected to the first cell output node (and thereby to the first bitline). The second programmable resistor can have second opposing end terminals connected to the second cell input node (and thereby to the corresponding bank input node) and connectable by a second switch to the second cell output node (and thereby to the second bitline). Additionally, in the array of memory banks, each row of memory banks will include an initial memory bank (i.e., the first memory bank in the row) and that initial memory bank can include amplifiers connected between the bank input nodes and the cells and track-and-hold devices (THs) connected to the bank input nodes. When such a structure is employed for in-memory processing, the THs and the individually selectable memory elements in each cell facilitate structure reuse (also referred to herein as fabric reuse) wherein the outputs generated by the structure for one processing layer in a series of processing layers can be fed back into the same structure as the inputs for the next processing layer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
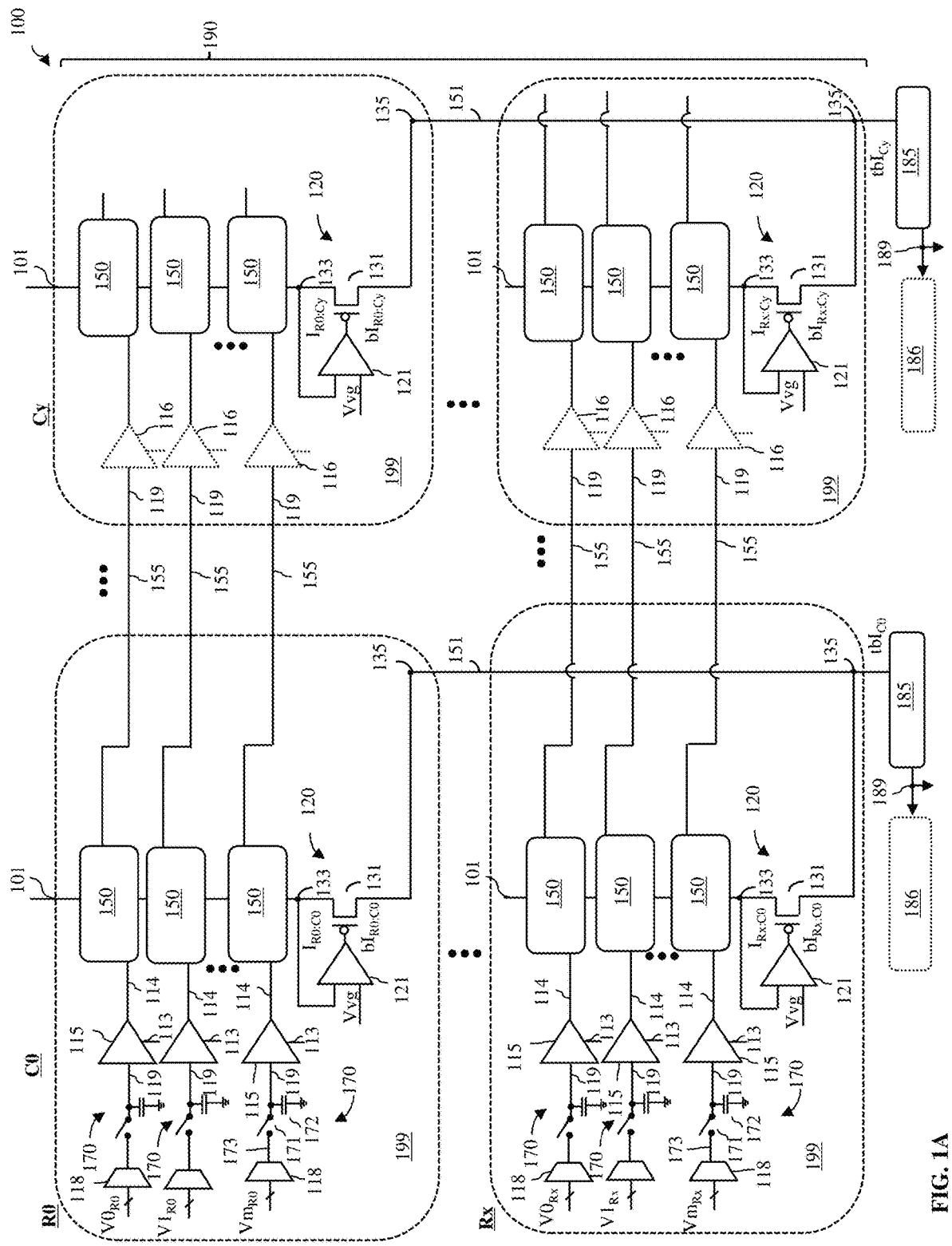
FIG. 1A is a schematic diagram illustrating an embodiment of a disclosed structure and FIG. 1B is a schematic diagram illustrative of a multi-memory element cell that can be incorporated into the structure of FIG. 1A.

As mentioned above, oftentimes, in a deep neural network designed, for example, for image processing, for audio processing, or for some ML or AI processing, the array of memory cells will need to be quite large. Unfortunately, such an increase in array size can result in an increase in local voltage ("IR") drops across the array, thereby leading to processing errors. Additionally, designers have to balance the need for increased through put over the need for reduced area consumption.

In view of the foregoing, disclosed herein are embodiments of a structure including a partitioned memory architecture, which includes single resistor memory elements or dual resistor memory elements. The structure is configured for in-memory processing with minimal IR drops. The structure is further configured to be reusable with each of multiple processing layers of a series of processing layers required for an in-memory processing application. That is, instead of the outputs of one processing layer in a series of processing layers from one structure being fed as inputs to an adjacent downstream structure for use in the next processing layer in the series, in the disclosed structure the outputs from one processing layer can be fed back into the same structure as the inputs for the next processing layer. Specifically, the disclosed structure can include memory banks arranged in columns and rows. Each memory bank can include multiple bank input nodes, multiple cells arranged in a single column, and at least one bitline. Each cell can be connected to a corresponding bank input node and to the bitline(s). Each cell can include multiple memory elements, which are associated with different processing layers of a series of processing layers (i.e., which are layer-specific), which are individually programmable to store layer-specific weight values, and which are individually selectable so that, for a specific processing layer, the appropriate layer-specific memory element is connected (e.g., by switches) to the corresponding bank input node and to the bitline(s) so that it can be employed for in-memory processing directed to the specific processing layer. The initial memory banks in each row can further include track-and-hold devices (THs) connected to the bank input nodes, respectively. For each iteration of in-memory processing (i.e., for each different processing layer), the outputs from one processing layer can be fed back to pre-designated THs (e.g., through multiplexors (MUXs)) for use as inputs (e.g., as activation values) for the next processing layer in the series, the appropriate layer-specific memory elements in the cells can be selected (i.e., connected by switches to the corresponding bank input nodes and bitline(s)) and output(s) for that next processing layer can be generated. While such a structure increases throughput time over architectures that enable pipeline processing of in-memory processing applications, it can be employed when fewer components and reduced area consumption is a more important design factor. The structure also includes a combination of amplifiers, feedback buffer circuits, and voltage buffers to minimize local IR drops and thereby minimize processing errors.

Figure 2A:
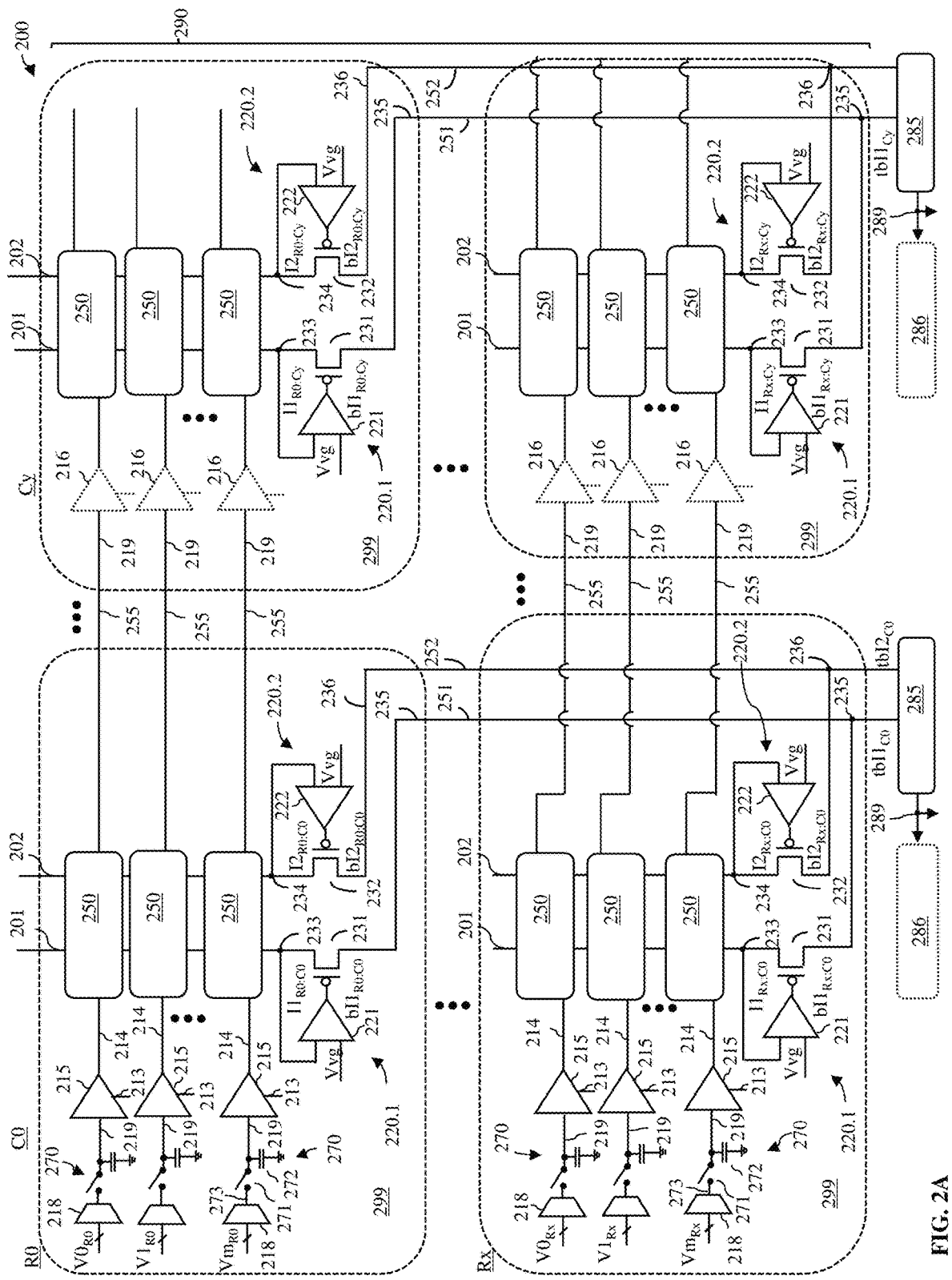
FIG. 2A is a schematic diagram illustrating another embodiment of a disclosed structure and FIG. 2B is a schematic diagram illustrative of a multi-memory element cell that can be incorporated into the structure of FIG. 2A.

FIGS. 1A and 2A are schematic diagrams illustrating disclosed embodiments of a structure 100 and 200, respectively. The structure 100, 200 includes a partitioned memory architecture configured for in-memory processing, such as for in-memory matrix vector multiplication processing, with minimal IR drops. The memory architecture is referred to as being a partitioned memory architecture because, during design, cells 150, 250 (which are described in detail below and which contain individually selectable memory elements associated with different processing layers of a series of processing layers required for completion of an in-memory processing application) are arranged in an array with some predetermined number of rows and some predetermined number of columns and then the cell array is partitioned into an array 190, 290 of memory banks 199, 299 (which each contain only a single column of cells and, more particularly, which each contain only a portion of one of the columns of cells of the cell array). The full size of the pre-partitioning cell array (i.e., the predetermined number of rows of cells for processing layer inputs and the predetermined number of columns of cells for processing layer outputs and, thus, the full size of the cell array) will depend on the in-memory processing application for which the structure is being designed. Specifically, the pre-partitioning cell array should have at least the number of rows of cells and the number of columns of cells required to perform the first and largest processing layer of a series of processing layers required for the particular in-memory processing application. Relatively complex neural networks (e.g., for image processing, for audio processing, or the like) can require a relatively large array to complete the first and largest processing layer (e.g., 10's or 100's of memory elements per row and column in the dual resistor memory element array). Those skilled in the art will recognize that the required array size will typically decrease with each processing layer in the series. For example, in an illustrative in-memory processing application, a first processing layer (Layer 1) could require an array size of 768×300, Layer 2 could require an array size of 300×100, Layer 3 could require an array size of 100×10, and, in this case, the last processing layer (Layer 4) could require an array size of 10×1). Thus, in this example, the cell array should be at least 768×300 or larger.

As discussed in greater detail below, in the disclosed embodiments, partitioning is employed to allow for the insertion of amplifiers, voltage buffers, and feedback buffer circuits into the structure 100, 200 to minimize IR drops. Additionally, also as discussed in greater detail below, in the disclosed embodiments, the structure 100, 200 is configured to be reusable with each of the multiple processing layers in a series of processing layers required for an in-memory processing application. That is, it is configured so that, instead of the outputs associated with one processing layer in the series being fed to an adjacent downstream structure for use as inputs for the next processing layer in the series, the outputs associated with one processing layer in the series can be fed back into the same structure as inputs for the next processing layer.

More particularly, as illustrated in FIGS. 1A and 2A, the structure 100, 200 can include an array of memory banks 199, 299 arranged in rows (R0-Rx) and columns (C0-Cy).

Figure 1B:
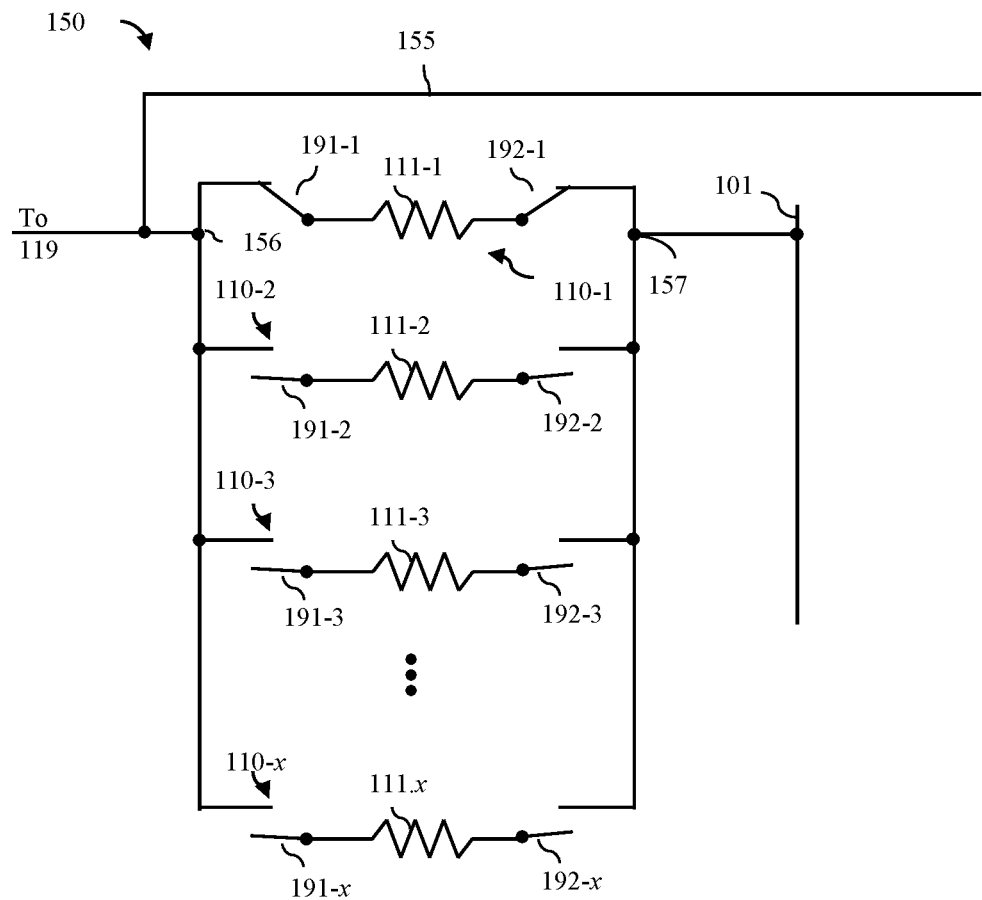
Figure 2B:
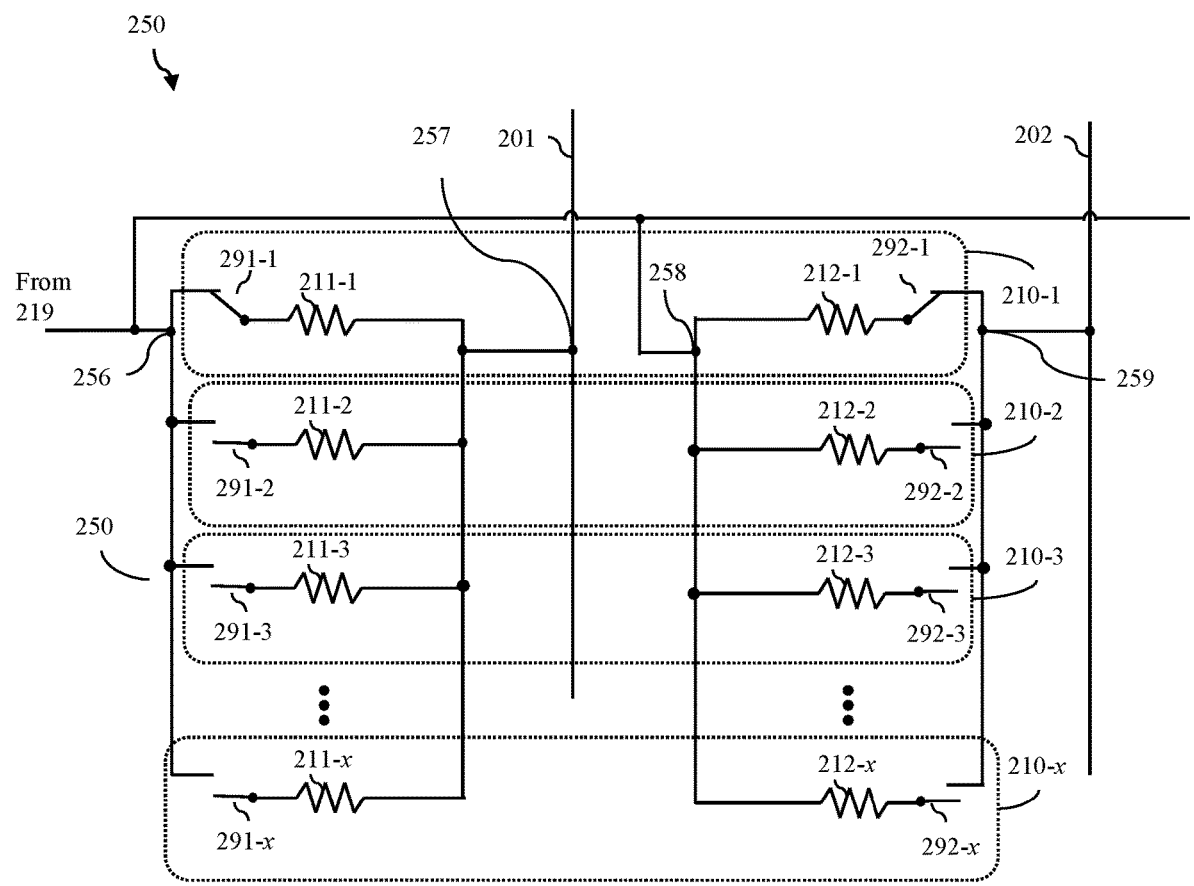
Figure 3A:
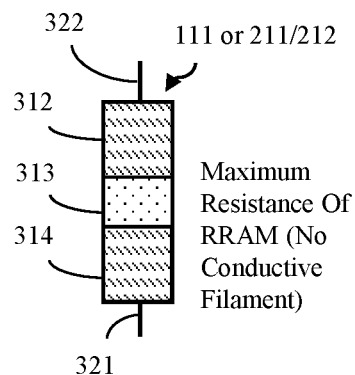
FIGS. 3A-3D are cross-section diagrams illustrating resistance states of a resistive random access memory (RRAM)-type programmable resistor that could be incorporated into the disclosed structure embodiments.
Figure 3B:
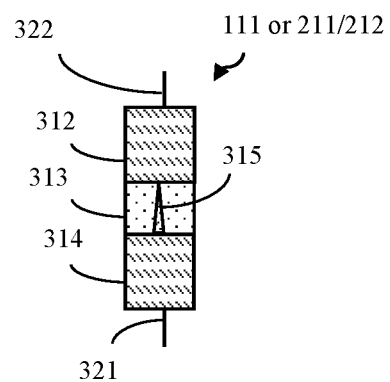
Figure 3C:
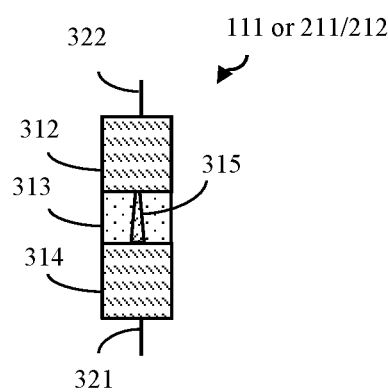
Figure 3D:
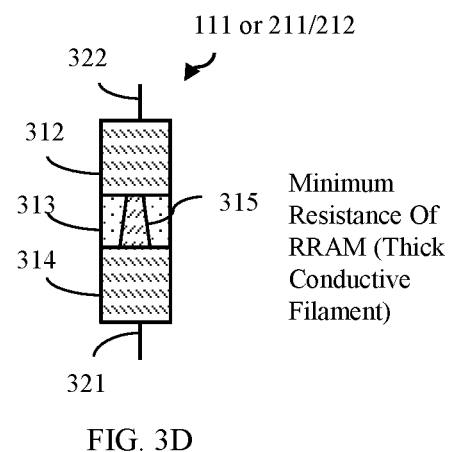

Each memory bank 199, 299 can further include multiple cells 150, 250 in a single column. FIG. 1B is a circuit diagram illustrating in greater detail a single cell 150 of the structure 100 of FIG. 1B. FIG. 2B is a circuit diagram illustrating in greater detail a single cell 250 of the structure 200 of FIG. 2A.

Referring specifically to FIGS. 1A-1B, in the structure 100 each memory bank 199 can include bank input nodes 119, a bitline 101, and cells 150, which as mentioned above are arranged in a single column. Each cell 150 can include cell input and output nodes 156-157, as shown in FIG. 1B. The cell input node 156 can be electrically connected to a corresponding one of the bank input nodes 119 of the memory bank 199 (either directly or indirectly through an amplifier 115 or voltage buffer 116, as discussed in greater detail below) and the cell output node 157 can be electrically connected to the bitline 101 for the memory bank 199. Each cell 150 can also include multiple memory elements (e.g., 110-1 to 110-x). Each of these memory elements 110-1 to 110-x can be a single resistor memory element and, more particularly, can include a single programmable resistor (e.g., see programmable resistor 111-1 of memory element 110-1, programmable resistor 111-2 of memory element 110-2, and so on). Additionally, the memory elements 110-1 to 110-x can be layer-specific and, more particularly, associated with a specific processing layer of a series of processing layers (e.g., 110-1 associated with Layer 1, 110-2 associated with Layer 2, 110-3 associated with Layer 3, . . . 110-x associated with Layer x). The memory elements 110-1 to 110-x can further be individually programmable to store layer-specific weight values (i.e., weight values to be employed in the specific processing layer) as a function of the specific programmed resistance of the programmable resistor.

Each of the memory elements 110-1 to 110-x in a cell 150 can further be individually selectable. Specifically, each cell 150 can also include pairs of switches with each pair of switches (including a first switch and a second switch). The programmable resistors 111-1 to 111-x of the memory elements 110-1 to 110-x can each have opposing end terminals connected to a corresponding pair of the switches (e.g., see first and second switches 191-1 and 192-1 at the opposing end terminals of the programmable resistor 111-1 of the memory element 110-1, the first and second switches 191-2 and 192-2 of the programmable resistor 111-2 of the memory element 110-2, and so on). These switches can be controllable so that each layer-specific memory element 110-1 to 110-x can be individually selected for operation when appropriate. That is, these switches can be controllable so that only the layer-specific memory element 110-1 is connected to the bank input node and bitline and, thus, operable during processing of the first processing layer (Layer 1), so that only the layer-specific memory element 110-2 is connected to the bank input node and bitline and, thus, operable during processing of the second processing layer (Layer 2), and so on.

Referring specifically to FIGS. 2A-2B, in the structure 200 each memory bank 299 can include bank input nodes 219, a first bitline 201, a second bitline 202, and multiple cells 250 arranged in a single column. Each cell 250 can include a first cell input node 256, a first cell output node 257, a second cell input node 258 and a second cell output node 259, as shown in FIG. 2B. The first cell input node 256 can be electrically connected to a corresponding one of the bank input nodes 219 of the memory bank 299 (either directly or indirectly through an amplifier 215 or voltage buffer 216, as discussed in greater detail below) and the first cell output node 257 can be electrically connected to the first bitline 201 for the memory bank 299. The second cell input node 258 can be electrically connected to the same corresponding bank input node 219 (either directly or indirectly, as mentioned above) of the memory bank 299 and the second cell output node 259 can be electrically connected to the second bitline 202 for the memory bank 199.

Each cell 250 can also include multiple memory elements (e.g., 210-1 to 210-x). Each of these memory elements 210-1 to 210-x can be a dual resistor memory element and, more particularly, can include first and second programmable resistors (e.g., see first and second programmable resistors 211-1 and 212-1 of memory element 210-1, first and second programmable resistors 211-2 and 212-2 of memory element 210-2, and so on). Additionally, the memory elements 210-1 to 210-x can be layer-specific or more, particularly, associated with a specific processing layer of a series of processing layer (e.g., 210-1 associated with Layer 1, 110-2 associated with Layer 2, 210-3 associated with Layer 3, . . . 210-x associated with Layer x). Furthermore, the programmable resistors of each memory element can be individually programmable to store total layer-specific weight values (i.e., total weight values to be employed in the specific processing layer) as a function of the specific programmed resistances of the first and second programmable resistors therein. For example, as discussed in greater detail below, the first programmable resistor of a given dual resistor memory element can be programmable to store a positive weight value as a function of its specific programmed resistance and the second programmable resistor of the same dual resistor memory element can be programmable to store a negative weight value as a function of its specific programmed resistance and these positive and negative weight values can be combined for the total weight value (see subtractor operation discussed further below). That is, in any given memory element in the cell 250 in the structure 200 of FIGS. 2A-2B, the first programmed resistance state of a first programmable resistor can be representative of a positive weight value, the second programmed resistance state of the second programmable resistor 212 can be representative of a negative weight value, and the total weight value stored in the dual resistor memory element can be a function of the first programmed resistance state (i.e., the positive weight value) and the second programmed resistance state (i.e., the negative weight value). That is, the total weight value stored in the memory element can be essentially equal to the difference between the positive weight value corresponding to the first resistance state of the first programmable resistor and the negative weight value corresponding to the second resistance state of the second programmable resistor. Preferably, at least one of the two programmable resistors in each dual resistor memory element can be pre-programmed to have a maximum resistance state, which is representative of no weight value. Thus, the total weight value stored in any given dual resistor memory element 210 will be equal to either the specific positive weight value represented by the programmed first resistance state of the first programmable resistor 211 (if the second programmable resistor 212 is programmed to the maximum resistance state) or the specific negative weight value represented by the programmed second resistance state of the second programmable resistor 212 (e.g., if the first programmable resistor 211 is programmed to the maximum resistance state). Alternatively, both programmable resistors can be programmed to have some weight value.

Furthermore, within each cell 250, the dual resistor memory elements 210-1 to 210-x are individually selectable.

That is, the first programmable resistors 211-1 to 211-$x$ of the dual resistor memory elements 210-1 to 210-$x$ can have input terminals connectable by first switches 291-1 to 291-$x$ to the first cell input node 256 (and thereby connectable to the bank input node 219) and output terminals connected to the first bitline 201. Additionally, within each cell 250, the second programmable resistors 212-1 to 212-$x$ of the dual resistor memory elements 210-1 to 210-$x$ can have input terminals connected to the second cell input node 258 (and thereby to the same bank input node 219) and output terminals connectable by second switches 292-1 to 292-$x$ to the second bitline 202. These first and second switches can be controllable so that each layer-specific memory element 210-1 to 210-$x$ can be individually selected for operation when appropriate. That is, these first and second switches can be controllable so that only the layer-specific memory element 210-1 is connected to both cell input nodes and both cell output nodes and thus operable during processing of the first processing layer (Layer 1), so that only the layer-specific memory element 210-2 is connected to both cell input nodes and both cell output nodes and, thus, operable during processing of the second processing layer (Layer 2), and so on. More particularly, the first and second switches are controllable so that the opposing end terminals of the first programmable resistor of a given layer-specific memory element are electrically connected to the first cell input and output nodes 256-257, respectively (and thereby to the corresponding bank input node 219 and to the first bitline 201) and further so that the opposing end terminals of the second programmable resistor of the same layer-specific memory element are electrically connected to the second cell input and output nodes 258-259 (and thereby to the corresponding bank input node 219 and the second bitline 202) and, thus, so that the given layer-specific memory element is operable.

Referring again to FIGS. 1A-1B and 2A-2B, in the structure 100, 200 the programmable resistors in the memory elements within each cell 150, 250 in each memory bank 199, 299 in the structure 100, 200 can be essentially the same (e.g., same design, same materials, etc.). Additionally, these programmable resistors can be any type of resistor having a controllable resistance and suitable for use as a non-volatile resistive memory element (i.e., a resistive memory element that retains its programmed resistance state even if/when the device loses power).

For example, each programmable resistor can be a resistive random access memory (RRAM)-type programmable resistor. Alternatively, each programmable resistor can be a phase change memory (PCM)-type programmable resistor, magnetic tunnel junction (MTJ)-type programmable resistor, or any other suitable type of programmable resistor configured so that, by applying specific bias conditions to one or both opposing end terminals of the resistor, the resistance of the programmable resistor can be changed between at least two different stable resistance states. For example, the resistance states of such a programmable resistor can be programmed to a maximum resistance state, to a minimum resistance state, and optionally to one or more resistance states along a continuum between the minimum and maximum resistance states. In some cases, the programmable resistors could have a significantly large number of different stable resistance states (e.g., 16 or more).

FIGS. 3A-3D illustrate an RRAM-type programmable resistor that could be employed in any given memory element 110-1 to 110-$x$, 210-1 to 210-$x$ as the programmable resistor(s). An RRAM is typically a back end of the line (BEOL) multi-layered structure, which includes two metallic layers 312 and 314 separated by a dielectric region 313 (also referred to herein as a resistance switching region). Depending upon the specific materials used and on the biasing conditions applied to the opposing end terminals 321-322 of such a resistor during a write operation, metal ions migrate to: (a) grow conductive filament(s) 315 in the dielectric region 313 extending between the metallic layers 312 and 314 so that the resistance state of the RRAM-type programmable resistor decreases or (b) break down conductive filament(s) within the dielectric region 313 between the metallic layers 312 and 314 so that the resistance state of the RRAM-type programmable resistor increases. Those skilled in the art will recognize that the total number of stable resistance states achievable with such an RRAM-type programmable resistor can vary depending upon the materials used and the biasing conditions. An RRAM-type programmable resistor could include metallic layers 312-314 (e.g., of platinum (Pt), titanium (Ti), titanium nitride (TiN), etc.) and, between the metallic layers 212-214, a dielectric region 313 including an oxide layer, such as a tantalum oxide ($Ta_2O_5$) layer, a hafnium oxide ($HfO_2$) layer, an iron oxide ($Fe_2O_3$) layer, a titanium oxide ($TiO_2$) layer, etc. However, the addition of one or more thin interface barrier layers (e.g., a second oxide layer, such as aluminum oxide ($Al_2O_3$) or some other oxide layer, an amorphous silicon layer, or some other suitable interface barrier layer) between the oxide layer and one or both metallic layers can improve the switching characteristics and increase the number of different detectable stable resistance states between a minimum resistance state and a maximum resistance state.

Figure 4A:
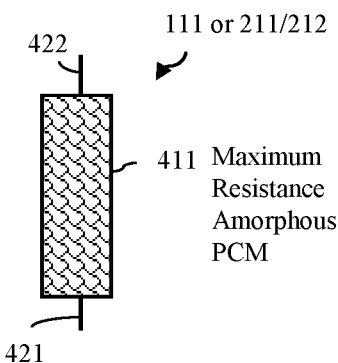
FIGS. 4A-4B are cross-section diagrams illustrating some resistance states of a phase change memory (PCM)-type programmable resistor that could be incorporated into the disclosed structure embodiments.
Figure 4B:
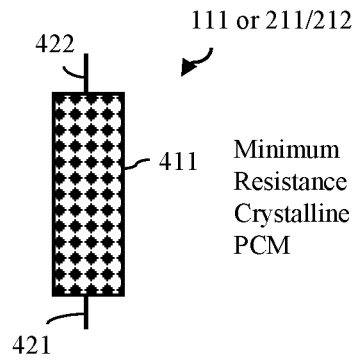

FIGS. 4A-4B illustrate a PCM-type programmable resistor that could be employed in any given memory element 110-1 to 110-$x$, 210-1 to 210-$x$ as the programmable resistor(s). A PCM-type programmable resistor includes a phase change material 411 (e.g., a chalcogenide compound) with programmable structural phases that exhibit different stable resistance states. For example, in a fully amorphous phase, exemplified by the drawing shown in FIG. 4A, the resistor will have the maximum resistance, whereas in a fully crystalline phase, exemplified by the drawing shown in FIG. 4B, the resistor will have the minimum resistance. In any phase between the fully amorphous phase and the fully crystalline phase (i.e., a partially amorphous and partially crystalline structure) the resistor will have a resistance between the maximum and the minimum resistances. Phase changes are dependent upon the local temperature of the PCM, which is controlled by the length and strength of an applied voltage. For example, changing from a crystalline phase toward or to an amorphous phase can be achieved by applying a short high voltage pulse to one or both of the opposing end terminals 421-422 in order to quickly heat the phase change material above its melting point, whereas changing from an amorphous phase toward or to a crystalline phase can be achieved by applying a longer lower voltage pulse to one or both of the opposing terminals 421-422 in order to heat the phase change material to its crystallization temperature and then allowing it to cool.

Figure 5A:
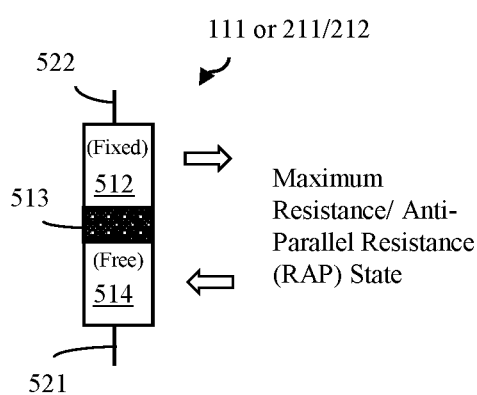
FIGS. 5A-5B are cross-section diagrams illustrating some resistance states of a magnetic tunnel junction (MTJ)-type programmable resistor that could be incorporated into the disclosed structure embodiments.
Figure 5B:
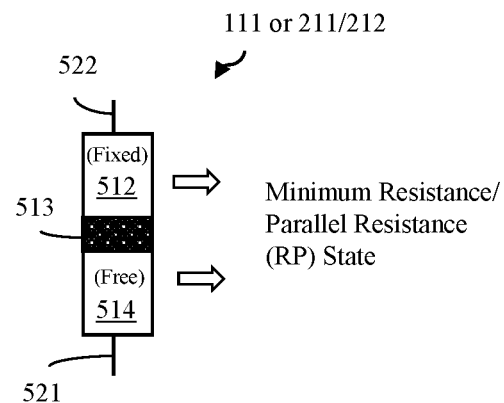

FIGS. 5A-5B illustrate an MTJ-type programmable resistor that could be employed in any given memory element 110-1 to 110-$x$, 210-1 to 210-$x$ as the programmable resistor(s). An MTJ-type programmable resistor is typically a back end of the line (BEOL) multi-layered structure, which includes a free ferromagnetic layer 514 (also referred to as a switchable layer) at a first terminal 521, a fixed ferromagnetic layer 512 (also referred to as a pinned layer) at a second terminal 522, and a thin dielectric layer 513 (e.g., a thin oxide layer) between the free ferromagnetic layer 514 and the fixed ferromagnetic layer 512. Depending upon the biasing conditions on the two terminals 521-522 and, particularly, depending on the voltage differential between the two terminals during a write operation, the MTJ-type programmable resistor can exhibit different stable resistance states. For example, during a write operation, a high positive voltage (Vcc) can be applied to the second terminal 522 and the first terminal 521 can be discharged to ground (e.g., at 0V). In this case, the free ferromagnetic layer 514 switches to (or maintains) the anti-parallel resistance (RAP) state (also referred to as a high resistance state) (see FIG. 5A). Alternatively, during the write operation, Vcc can be applied to the first terminal 521 and the second terminal 522 can be discharged to ground (e.g., at 0V). In this case, the free ferromagnetic layer 514 switches to (or maintains) a parallel resistance (RP) state (also referred as a low resistance state) (see FIG. 5B). The MTJ structure described above has two resistance states. However, the example is not intended to be limiting and those skilled in the art will recognize that MTJ-type programmable resistors have been developed that can exhibit more than two different resistance states.

Referring again to FIGS. 1A-1B and 2A-2B, as mentioned above during design a cell array with a predetermined number of rows and a predetermined number of columns of cells is partitioned into memory banks 199, 299. Each memory bank 199, 299 can have the same number (m+1) of multiple rows (r0-rm) of cells 150, 250 therein and the total number of memory banks 199, 299 in each column times the total number of rows of cells 150, 250 in each memory bank 199, 299 can be equal to the total number of rows of cells 150, 25 as in cell array prior to partitioning. Thus, for example, if a 64×64 cell array is partitioned in the structure 100, 200, there will be 64 columns (C0-C63) of memory banks and x+1 rows (R0-Rx) of memory banks 199, 299, each with m+1 rows (r0-rm) of cells 150, 250, where x≥1 and m≥1, where 64 is divisible by x+1, and where the number m+1 is a whole number equal to 64/x+1. That is, the number of rows (R0-Rx) of memory banks 199, 299 could be 2 with each memory bank 199, 299 having 32 rows (r0-rm) of cells 150, 250; the number of rows (R0-Rx) of memory banks 199, 299 could be 4 with each memory bank 199, 299 having 16 rows (r0-rm) of cells 150, 250; the number of rows (R0-Rx) of memory banks 199, 299 could be 8 with each memory bank having 8 rows (r0-rm) of cells 150, 250; and so on. Similarly, if a 128×128 cell array is partitioned in the structure 100, 200 there will be 128 columns (C0-C$_{127}$) of memory banks 199 and x+1 rows (R0-Rx) of memory banks 199 with m+1 rows (r0-rm) of cells 150, 250 in each memory bank 199, 299, where x≥1 and m≥1, where 128 is divisible by x+1, and where the number m+1 is a whole number equal to 128/x+1. If a 256×256 cell array is to be partitioned in the structure 100, 200, there will be 256 columns (C0-C255) of memory banks 199, 299 and x+1 rows (R0-Rx) of memory banks 199, 299 with m+1 rows (r0-rm) of cells 150, 250 in each memory bank 199, 299, where x≥1 and m≥1, where 256 is divisible by x+1, and where the number m+1 is a whole number equal to 256/x+1, and so on. For purposes of illustration, a 2×2 memory bank array with only three rows of cells per memory bank is shown in the figures.

However, it should be noted that during design partitioning of the cell array into memory banks is performed by designers to minimize the effect of wiring resistance across the array. Thus, there is no requirement for uniform partitioning. For example, in some embodiments each memory bank could have the maximum number of rows necessary before buffering becomes necessary with the last memory bank in each column having some lessor number of rows to include. In other embodiments, the number of rows in each memory back in each column can drop (with each memory bank or with each group of memory banks) between the first memory bank in the column to the last memory bank in the column. Therefore, it should be understood that the figures are not intended to be limiting. Alternatively, the memory bank array 190, 290 in the structure 100, 200 could include any number of two or more columns (C0-Cy) of memory banks 199, 299 and any number of two or more rows (R0-Rx) of memory banks 199, 299 with any number of two or more rows (r0-rm) in any given memory bank within each column with the number of rows in each memory bank in each column being the same or different.

The discussion below refers to initial or first memory banks in the rows (R0-Rx) of memory banks 199, 299 (i.e., to all of the memory banks in the first column (C0)). Within the structure 100, 200, each initial memory bank can include MUXs 118, 218, THs 170, 270 and amplifiers 115, 215. Specifically, in each initial memory bank 199, 299, there is an amplifier 115, 215 connected between the bank input node 119, 219 and each cell 150, 250 and there is also a TH 170, 270 connected between the output of a MUX 118, 218 and the input of an amplifier 115, 215.

Specifically, in each initial memory bank 199, 299, there is a MUX 118, 218 connected to a TH 170, 270, which is connected to a bank input node 119, 219, and an amplifier 115, 215 connected in series between the bank input node (and thereby the TH 170, 270) and a cell 150, 250. When the structure 100, 200 is in the normal operational mode for in-memory processing (e.g., for in-memory matrix vector multiplication processing) of a processing layer, MUXs 118, 218 provide input voltages to analog voltage terminals 173 and the input voltages are sampled by THs 170, 270 so that they are received at the corresponding bank input nodes 119, 219 (e.g., V0$_{R0}$ at the first row (r0) in the bank R0:C0, V1$_{R0}$ at the second row (r1) in the bank R0:C0; and so on).

As illustrated, each MUX 118, 218 can be a multi-input, single-output MUX. The inputs to each MUX can include, for example, at least one input for receiving an analog input voltage generated externally (e.g., an initial analog input voltage from a sample of analog input voltages corresponding to activation values for a first processing layer (Layer 1)) and at least one input for receiving an internally generated voltage (e.g., an output voltage from one processing layer to be employed as an input voltage for the next processing layer). Optionally, each MUX can include inputs that receive the output voltages from each of the columns, respectively. In any case, each MUX can be controlled to provide the appropriate input voltage for a given processing layer to be sampled by the TH connected thereto.

Those skilled in the art will recognize that a TH refers to an analog device that samples the voltage of a variable analog signal (e.g., in response to a control signal, such as a clock signal or some other control signal) and stores its value at for some period of time (e.g., dependent upon the control signal). Each TH 170, 270 can, as illustrated, include a switch 171, 271 (e.g., a transistor-based switch or some other suitable switch) and a capacitor 172, 272. The switch 171, 271 can be connected on one side to an analog voltage terminal 173, 273 (in this case the output of a MUX 118, 218) and on the opposite side to a track node (e.g., at the bank input node 119, 219 for the memory element 110, 210). The capacitor 172, 272 can be connected between the track node and ground. Such a TH 170, 270 can be operable in a track mode and a hold mode. In the track mode, the switch 171, 271 connects the analog voltage terminal 173, 273 to the track node and the capacitor 172, 272 stores a stored voltage equal to the sampled analog voltage at the analog voltage terminal 173, 273. In the hold mode, the switch 171, 271 disconnects the analog voltage terminal 173, 273 from the track node such that variations in the analog voltage received from the MUX do not impact circuit operation. It should be understood that the TH structure described above and illustrated in the drawings is not intended to be limiting. Alternatively, any other suitable TH device, which is configured for track-and-hold operations as described above, could be employed. As discussed in greater detail below, the THs 170, 270 enable pipeline processing. Additionally, such THs can enable interruptions in normal operations (e.g., mid-stream) to preform maintenance operations (e.g., calibration, refreshment programming, etc.) without resulting in data loss.

For any given processing layer, an amplifier 115, 215 in an initial memory bank can receive a specific input voltage from a TH 170, 270 (e.g., via the MUX 118, 218) and can be configured to generate and output a level shifted input voltage 114, 214 that is essentially equal to the sum of the specific input voltage and a virtual ground voltage (Vvg), as discussed in greater detail below. That is, the amplifier 115, 215 can add Vvg to the received input voltage to generate and output a level shifted input voltage. For example, the first amplifier 115, 215 in Bank R0:C0 that receives $V0_{R0}$ can generate and output a level shifted input voltage 114, 214 equal to $V0_{R0}$ plus Vvg, the next amplifier 115, 215 in Bank R0:C0 that receives $V1_{R0}$ can generate and output a level shifted input voltage 114, 214 equal to $V1_{R0}$ plus Vvg, and so on with the last amplifier 115, 215 in Bank Rx:C0 generating and outputting a level shifted input voltage 114, 214 equal to $Vm_{Rx}$ plus Vvg. The level shifted input voltage 114, 214 output from any given amplifier 115, 215 will be applied to the cell 150, 250 and thereby to the layer-specific memory element that has been selected and is operable for that given processing layer. That is, in the structure 100, depending upon the processing layer at issue, the level shifted input voltage 114 will be applied to the input terminal of the programmable resistor of the selected layer-specific memory element through the cell input node 156 (e.g., for Layer 1, a level-shifted input voltage 114 will be applied to the input terminal of the programmable resistor 111-1 of selected layer-specific memory element 110-1; for Layer 2, the level-shifted input voltage 114 will be applied to the input terminal of selected layer-specific memory element 110-2, and so on). In the structure 200, depending upon the processing layer at issue, the level shifted input voltage 214 will be applied to the input terminal of the first programmable resistor of the selected layer-specific memory element through the first cell input node 256 and to the input terminal of the second programmable resistor of the selected layer-specific memory element through the second cell input node 258 (e.g., for Layer 1, the level shifted input voltage 214 will be applied to the input terminal of the first programmable resistor 211-1 of the selected layer-specific memory element 210-1 through the first cell input node 256 and to the input terminal of the second programmable resistor 212-1 of the selected layer-specific memory element 210-1 through the second cell input node 258; for Layer 2, the level shifted input voltage 214 will be applied to the input terminal of the first programmable resistor 211-2 of the selected layer-specific memory element 210-2 through the first cell input node 256 and to the input terminal of the second programmable resistor 212-2 of the selected layer-specific memory element 210-2 through the second cell input node 258; and so on).

Those skilled in the art will recognize that Vvg is used in analog circuits to refer to a voltage, which is established on a node, which has a certain DC bias that is maintained at a steady reference potential without being connected directly to that reference potential, and which has 0V from an AC perspective. Vvg is typically established on a node to essentially function as a "ground" terminal that is level shifted by a fixed DC amount. For example, amplifiers can be configured in a negative feedback loop to force their negative input voltage to be equal to the positive input voltage. In this context, the negative input voltage is referred to as Vvg because there is effectively no potential difference between it and the positive terminal. Alternatively, Vvg could be established with a large capacitor which holds a DC voltage and essentially has zero AC across it. Each amplifier 115, 215 can be a simple voltage level shifter (also referred to herein as a level shifting amplifier). Alternatively, each amplifier 115, 215 can be configured as a multistate amplifier, where the output state of any given amplifier 115, 215 is controlled by a unique control bit 113, 213 for that amplifier (e.g., control bit $S0_{R0}$ for the amplifier 115, 215 in the first row of the first initial memory bank R0:C0, control bit S1 R0 for the amplifier 115, 215 in the next row of the first initial memory bank R0:C0, and so on until the last control bit 113, 213 for the amplifier 115, 215 of the last row of the last initial memory bank Rm:C0). In this case, depending upon the control bit received, an amplifier 115, 215 can output a level shifted input voltage (e.g., during the normal operational mode) or some other suitable output, such as a low output (e.g., ground), a high output (e.g., Vcc), or a high impedance (HiZ) output. Different outputs, such as a low voltage, a high voltage, or a HiZ output, could facilitate other operational modes such as program or erase operations, as described in greater detail below.

The structure 100, 200 can further include sets of row interconnect lines 155, 255. Each set of row interconnect lines 155, 255 can interconnect adjacent memory banks within the same row (R0-Rx) of memory banks. Specifically, in the structure 100 of FIGS. 1A-1B, each row interconnect line 155 within a set between adjacent memory banks of a given row of memory banks can connect the first cell input node 156 of one cell 150 at a particular bank row address (e.g., r0-rm) to the first cell input node 156 of another cell at the same bank row address in an adjacent downstream memory bank. In the structure 200 of FIGS. 2A-2B, each row interconnect line 255 within a set between adjacent memory banks of a given row of memory banks can electrically connect the first and second cell input nodes 256 and 258 of one cell 250 at a particular bank row address (e.g., r0-rm) together and further to the first and second cell input nodes of another cell at the same bank row address in an adjacent downstream memory bank. Thus, the level shifted input voltages generated by the amplifiers in the initial memory banks are transmitted along row interconnect lines to cells (and thereby memory elements) at the same address in the downstream memory banks within the same row.

Optionally, to minimize IR drops across the row interconnect lines as the level shifted input voltages are communicated to each cell at the same address in each memory bank in the same row, some embodiments of the disclosed structure can include optional voltage buffers 116, 216 (also referred to herein as voltage boost amplifiers). For example, if the size of the array of memory banks is relatively large and, particularly, if the number of columns (C0-Cy) of memory banks is so large that significant IR drops are exhibited along the row interconnect lines 155, 255, then at least some of memory banks 199, 299 can have integrated voltage buffers 116, 216 (e.g., between the bank input nodes 119, 219 and the memory elements 110, 210) to buffer the level shifted input voltages and, thereby compensate for IR drops.

As mentioned above, in the structure 100 of FIGS. 1A-1B, each memory bank 199 can have a single bitline 101. In the structure 200 of FIGS. 2A-2B, each memory bank 299 can have a first bitline 201 and a second bitline 202. Each memory bank 199, 299 can further include, for each bitline, a bias node, a bank output node, and a feedback buffer circuit. Specifically, each memory bank 199 in the structure 100 of FIGS. 1A-1B can include a bias node 133 at one end of the bitline 101, a bank output node 135, and a feedback buffer circuit 120, which is connected to the bias node 133 and the bank output node 135. The feedback buffer circuit 120 can include, for example, a first transistor 131 (e.g., a first P-type field effect transistor (first PFET)) connected in series between the bias node 133 and the bank output node 135 and a buffer amplifier 121, which has one input connected to the bias node 133, another input connected to receive Vvg, and an output connected to the gate of the PFET 131. Similarly, each memory bank 299 of the structure 200 of FIGS. 2A-2B can include a first bias node 233 on the first bitline 201, a first bank output node 235, and a first feedback buffer circuit 220.1, which is connected to the first bias node 233 and to the first bank output node 235. The first feedback buffer circuit 220.1 can include, for example, a first transistor 231 (e.g., a first P-type field effect transistor (first PFET)) connected in series between the first bias node 233 and the first bank output node 235 and a first buffer amplifier 221, which has one input connected to the first bias node 233, another input connected to receive Vvg, and an output connected to the gate of the first PFET 231. Additionally, each memory bank 299 can further include a second bias node 234 on the second bitline 202, a second bank output node 236, and a second feedback buffer circuit 220.2, which is connected to the second bias node 234 and to the second bank output node 236. The second feedback buffer circuit 220.2 can specifically include a second transistor 232 (e.g., a second PFET) connected in series between the second bias node 234 and the second bank output node 236 and a second buffer amplifier 222, which has one input connected to the second bias node 234, another input connected to receive Vvg, and an output connected to the gate of the second PFET 232.

With the above-described feedback buffer circuit(s) in each memory bank 199, 299, when the structure 100, 200 is in the normal operational mode for in-memory processing of any given processing layer, the bias node on each bitline can be biased to Vvg. Additionally, as mentioned above, the level shifted input voltages, which have each been level shifted by Vvg and which are output by the amplifiers 115, 215, are received at the cells in the initial memory banks and further received at the cells at the same address in the downstream memory banks. As a result, the voltage across the programmable resistor(s) of each selected layer-specific memory element in the cells at the same address in memory banks within the same row will be essentially equal to the received input voltage. Additionally, output currents from the programmable resistor(s) of the selected layer-specific memory elements of the cells in a memory bank are output to and summed on the bitline(s) for that memory bank. For example, in each memory bank 199 in the structure 100 of FIGS. 1A-1B, during a normal operating mode to complete a given processing layer, output currents from all programmable resistors of all selected layer-specific memory elements in the cells of a memory bank are output to and summed on the bitline 101 for that memory bank, thereby generating a bank-specific output current (I). This bank-specific output current is further buffered by the feedback buffer circuit such that a buffered bank-specific output current (bI), which is dependent on the sum of all output currents from all programmable resistors of all selected layer-specific memory elements in the memory bank, is output on the bank output node 135 for the memory bank. Similarly, in each memory bank 299 in the structure 200 of FIGS. 2A-2B, during a normal operational mode to complete a given processing layer, first output currents from all first programmable resistors of all selected layer-specific memory elements in a memory bank are output to and summed on the first bitline 201, thereby generating a bank-specific first output current (I1). This bank-specific first output current is further buffered by the first feedback buffer circuit such that a buffered bank-specific first output current (bI1), which is dependent on the sum of all first output currents from all first programmable resistors of all selected layer-specific memory elements in the memory bank, is output on the first bank output node 235 for that memory bank. Similarly, second output currents from all second programmable resistors of all selected layer-specific memory elements in the same memory bank are output to and summed on the second bitline 202, thereby generating a bank-specific second output current (I2). This bank-specific second output current (I2) is further buffered by the second feedback buffer circuit such that a buffered bank-specific second output current (bI2), which is dependent on the sum of all the second output currents from each second programmable resistor of each selected layer-specific memory element in the memory bank, is output on the second bank output node 236 of that memory bank.

The structure 100, 200 can further include column interconnect line(s) for the columns, respectively. For example, the structure 100 of FIGS. 1A-1B can include a column interconnect line 151 for each column and electrically connected to all bank output nodes 135 of all memory banks 199 in that column. That is, the column interconnect line 151 for column C0 will be connected to the bank output nodes 135, respectively, of all memory banks in the column C0 (i.e., for Banks R0:C0-Rx:C0), and so on. When the structure 100 is in the normal operational mode to complete a given processing layer, the column interconnect line 151 for any specific column can receive and sum the buffered bank-specific output currents from all the memory banks in that specific column, thereby generating a column-specific output current (e.g., $tbI_{C0}=bI_{R0:C0}+ \ldots +bI_{Rx:C0}; \ldots$; and $tbI_{Cy}=bI_{R0:Cy}+ \ldots +bI_{Rx:Cy}$). Similarly, the structure 200 of FIGS. 2A-2B can include a pair of column interconnect lines for each column. Each pair of column interconnect lines can include a first column interconnect line 251, which is electrically connected to all first bank output nodes 235 of all memory banks 299 in the same column, and a second column interconnect line 252 connected to all second bank output nodes 236 of all memory banks in the same column. That is, the first and second column interconnect lines 251-252 for column C0 will be connected to the first and second bank output nodes 235-236, respectively, of all memory banks in the column C0 (i.e., for Banks R0:C0-Rx:C0), and so on. When the structure 200 is in the normal operational mode to complete a given processing layer, the first column interconnect line 251 for any specific column can receive and sum the buffered bank-specific first output currents from all the memory banks in that specific column, thereby generating a column-specific first output current (e.g., $tbI1_{C0}=bI1_{R0:C0}+ \ldots +bI1_{Rx:C0}; \ldots$; and $tbI1_{Cy}=$ $bI1_{R0:Cy}+ \ldots +bI1_{Rx:Cy}$). Similarly, the second column interconnect line 252 for the specific column can receive and sum the buffered bank-specific second output currents from all the memory banks in the specific column, thereby generating a column-specific second output current (e.g., $tbI2_{C0}=bI2_{R0:C0}+ \ldots +bI2_{Rx:C0}$; ...; and $tbI2_{Cy}=bI2_{R0:Cy}+ \ldots +bI2_{Rx:Cy}$). In each of these structures 100 and 200, by buffering the bank-specific output currents output to each column interconnect line the impact of wiring resistance across the length of the columns is diminished.

The structure 100, 200 can further include data processing elements 185, 285 at the end of each column.

Referring specifically to FIGS. 1A-1B, the structure 100 can further include data processing elements 185 and, particularly, current-to-voltage converters (also referred to herein as converters or current-to-voltage converter circuits) for each column. Each current-to-voltage converter 185 can be connected to the column interconnect line 151 for that column, can receive the column-specific output current from the column interconnect line 151, and can generate and output a column-specific analog output voltage 189 based on the column-specific output current. Since output currents from selected layer-specific memory elements in the cells of each memory bank are generated on the bitline 101 in the memory bank as a function of programmed resistance states representing a weight value and on received input voltages representing activation values, the column-specific output current on each column interconnect line 151 can represent a current value solution for a dot product computation and the column-specific analog output voltage can represent a voltage value solution for that dot product computation.

FIGS. 6A-6E are schematic diagrams illustrating current-to-voltage converters 185, respectively, that could be incorporated into the structure 100.

Figure 6A:
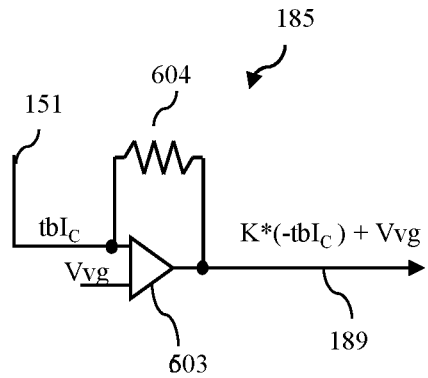
FIGS. 6A-6E are schematic diagrams illustrating current-to-voltage converters that could specifically be incorporated into the structure of FIG. 1A.

The current-to-voltage converter 185 of FIG. 6A includes an amplifier 603 and a feedback resistor 604. The amplifier 603 has a first input connected to the column interconnect line 151, a second input connected to receive Vvg, and an output. The feedback resistor 604 is connected between the output and the first input of the amplifier. The feedback resistor 604 can be the same type of programmable resistor as that used in the layer-specific memory elements 110-1 to 110-x of the cells 150. It should be noted that the polarity of the column-specific analog output voltage 189 from the amplifier 603 will be the opposite of that of the column-specific output current on the column interconnect line 151.

Figure 6B:
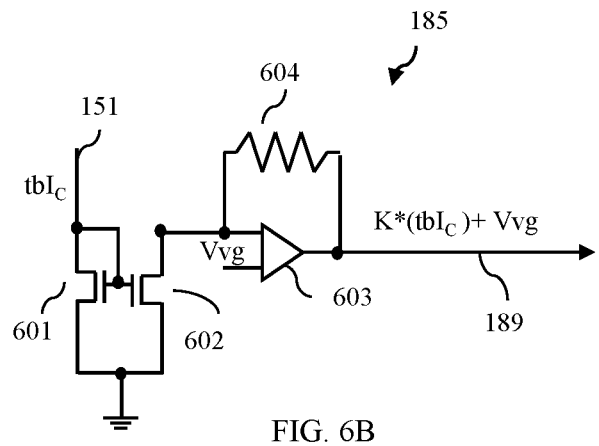

The current-to-voltage converter 185 of FIG. 6B is similarly to the current-to-voltage converter of FIG. 6A but includes additional circuitry to ensure the polarity of the column-specific output current on the column interconnect line and the column-specific output voltage are the same. That is, the current-to-voltage converter 185 includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6C:
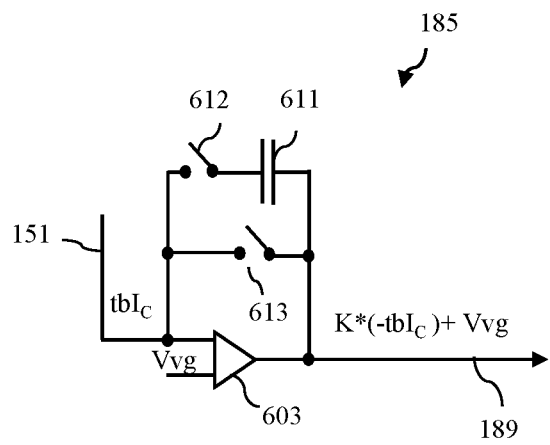

The current-to-voltage converter 185 of FIG. 6C includes the amplifier 603, but instead of a feedback resistor, it can include a feedback switched capacitor circuit. Specifically, the amplifier 603 has a first input connected to the column interconnect line 151, a second input connected to receive Vvg, and an output. The feedback switched capacitor circuit includes a capacitor 611 that is connected to the output of the amplifier 603 and further connected by a first switch 612 to the first input. The feedback switched capacitor circuit can also include a bypass switch 613 that connects the output to the first input of the amplifier 603, bypassing the capacitor 611. In operation, initially the bypass switch 613 is closed to stabilize the high impedance node at Vvg. Then, the bypass switch 613 is opened and there will be a finite integration time across the capacitor 611. This integration time can be made to be proportional to the temperature coefficient of a programmable resistor used in the memory elements 110-1 to 110-x of each cell 150. Alternatively, the integration time can be made proportional to a resistor that is made of the same material as the programmable resistors and whose value at the typical temperature of operation is fixed. For example, a resistor value can be selected that has a nominal resistor value representative of the variety of resistor values that can appear in the programmable resistors within the array. That is, if the programmable resistors within the array can have values between 20k and 500k, then a nominal resistor value (e.g., 50k) can be selected based on simulations and measurements to minimize the impact of the TCs of the resistors used in the array. It should be noted that this integration time will also determine the magnitude of the output signal and will compensate for the temp-coefficient. Furthermore, due to the switched capacitor circuit configuration, the value of the output can be held for some duration of time (e.g., track-and-hold circuit), the capacitor 611 can reference some other bias potential, and the power for the op-amp can be turned off to save power. It should be noted that the polarity of the column-specific analog output voltage 189 from the amplifier 603 will be the opposite that of the column-specific output current on the column interconnect line 151.

Figure 6D:
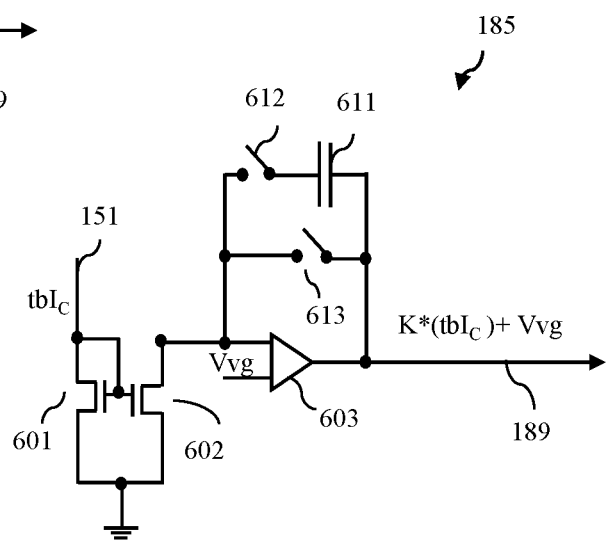

The current-to-voltage converter 185 of FIG. 6D is similar to the current-to-voltage converter of FIG. 6C but includes additional circuitry to ensure the polarity of the column-specific output current on the column interconnect line and the column-specific output voltage are the same. Specifically, in this case the current-to-voltage converter includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6E:
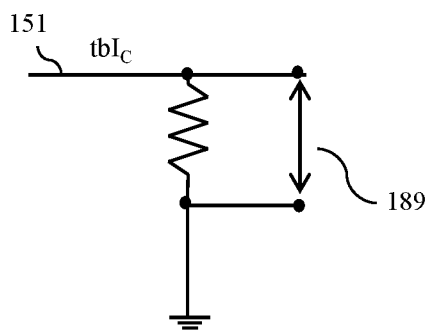

The current-to-voltage converters described above and illustrated in FIGS. 6A-6D are provided for illustration purposes and are not intended to be limiting. Alternatively, any other suitable current-to-voltage converter circuit could be incorporated into the structure 100. For example, the current-to-to voltage converter could, alternatively, be in the form of a simple resistor connected between the column interconnect line and ground, as shown in FIG. 6E.

Referring specifically to FIGS. 2A-2B, the structure 200 can include data processing elements 285 and, particularly, subtractors (also referred to herein as subtractor circuits). Each subtractor 285 for each column can be connected to the pair of the column interconnect lines 251-252 for that column, can receive the column-specific first output current from the first column interconnect line 251 and the column-specific second output current from the second column interconnect line 252 (e.g., $tbI1_{C0}$ and $tbI2_{C0}$; ...; and $tbI1_{Cy}$ and $tbI2_{Cy}$, respectively), and can generate and output a column-specific analog output parameter 289 (e.g., a column-specific analog output voltage ($Vout_{C0-y}$) or column-specific analog output current ($Iout_{C0-y}$)) based on the difference between the column-specific first output current and the column-specific second output current (e.g., $Vout_{C0}$ or $Iout_{C0}$ as a function of $tbI1_{C0}$-$tbI2_{C0}$; ... ; and $Vout_{Cy}$ or $Iout_{Cy}$ as a function of $tbI1_{Cy}$-$tbI2_{Cy}$, respectively). Since each first output current is generated on a first bitline 201 in a memory bank as a function of a first programmed resistance state representing a positive weight value and an input voltage that represents an activation value and since each second output current is generated on the second bitline 202 in each memory bank as a function of a second programmed resistance state representing a negative weight value and the same input voltage, the column-specific first output current can represent a solution for a positive side of a dot product computation, the column-specific second output can represent a solution for a negative side of a dot product computation, and the column-specific analog output parameter (e.g., the analog output voltage) can represent the combined solution for the dot product computation.

Figure 7A:
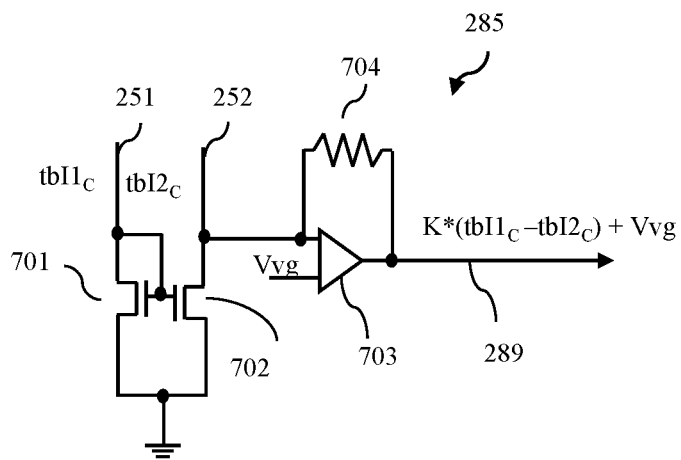
FIGS. 7A-7B are schematic diagrams illustrating subtractor circuits that could specifically be incorporated into the structure of FIG. 2A.
Figure 7B:
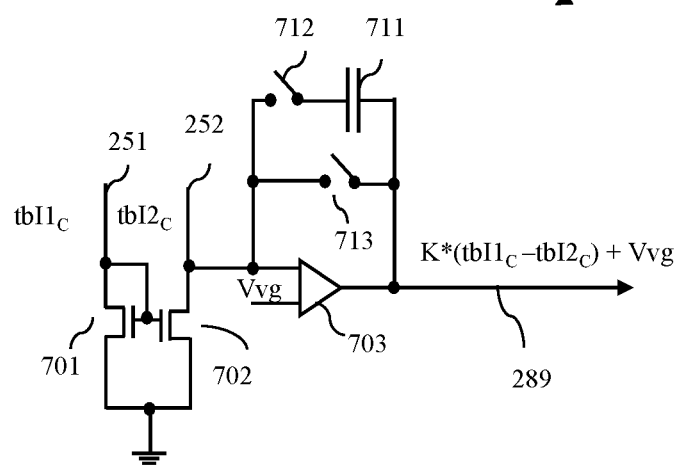

FIGS. 7A-7B are schematic diagrams illustrating subtractors 285, respectively, that could be incorporated into the structure 200.

The subtractor circuit 285 of FIG. 7A includes a first stage and a second stage. The first stage includes first and second n-type field effect transistors (NFETs) 701-702 connected in series between the first and second column interconnect lines 151-152, respectively, of a given column and ground. The drain node of the first NFET 701 control the gates of the first and second NFETs 701-702. The second stage includes an amplifier 703 and a feedback resistor 704. The amplifier has a first input connected to the drain node of the second NFET 702, a second input connected to receive Vvg, and an output. The feedback resistor 704 is connected between the output and the first input of the amplifier. The feedback resistor 704 can be the same type of programmable resistor used in the layer-specific memory elements 210-1 to 210-$x$ of each cell 250.

The subtractor circuit of FIG. 7B similarly includes a first stage and a second stage. The first stage of FIG. 7B is essentially the same as the first stage in FIG. 7A, as discussed above. The second stage includes an amplifier 503, but instead of a feedback resistor, it includes a feedback switched capacitor circuit. Specifically, the amplifier 703 has a first input connected to the drain node of the second NFET 702, a second input connected to receive Vvg, and an output. The feedback switched capacitor circuit includes a capacitor 711 that is connected to the output of the amplifier 703 and further connected by a first switch 712 to the first input. The feedback switched capacitor circuit includes a bypass switch 713 that connects the output to the first input of the amplifier 703, bypassing the capacitor 711. In operation, initially the bypass switch 713 is closed to stabilize the high impedance node at Vvg. Then, the bypass switch 713 is opened and there will be a finite integration time across the capacitor 711. This integration time can be made proportionate to the value of a programmable resistor used in the memory elements. For example, a resistor value can be selected that has a nominal resistor value representative of the variety of resistor values that can appear in the programmable resistors within the array. That is, if the programmable resistors within the array can have values between 20k and 500k, then a nominal resistor value (e.g., 50k) can be selected based on simulations and measurements to minimize the impact of the TCs of the resistors used in the array. It should be noted that this integration time will also determine the magnitude of the output signal from the subtractor and will compensate for the temp-coefficient. Furthermore, due to the switched capacitor circuit configuration, the value of the output can be held for some duration of time (e.g., track-and-hold device), the capacitor 711 can reference some other bias potential, and the power for the op-amp can be turned off to save power.

The subtractor circuits described above and illustrated in FIGS. 7A-7B are provided for illustration purposes and are not intended to be limiting. Alternatively, any other suitable subtractor circuit could be incorporated into the structure 200.

Optionally, the structure 100, 200 can further include output monitors 186, 286 connected to the data processing elements 185, 285. Each monitor 186, 286 could be, for example, a comparator that compares the column-specific analog output voltage to a predetermined voltage. The predetermined voltage could be, for example, Vvg and if the column-specific analog output voltage is higher than Vvg, then the column-specific analog output voltage can be used during the next processing stage. However, if the column-specific analog output voltage is lower than Vvg (i.e., if the output of the comparator is negative), it can be flagged. Then any of the following could be performed: (1) the voltage could be nulled and presented to the next processing stage; or (2) the voltage can be attenuated (e.g., by using an uncharged capacitor for charge sharing) to create a piecewise linear transfer function.

As mentioned above, FIGS. 1A-1B and 2A-2B are schematic diagrams illustrating embodiments of a structure 100, 200 including a partitioned memory architecture configured for in-memory processing, such as in-memory matrix vector multiplication processing, including structure reuse (also referred to herein as fabric reuse). Specifically, with conventional in-memory processing each processing layer of a series of processing layers (e.g., each multiply and accumulate (MAC) layer) is typically performed by a discrete structure with the outputs from one structure for one MAC layer being fed, as inputs, to the next structure for the next MAC layer in the series. The number of inputs into a MAC Layer will be greater than the number of outputs from that MAC layer and, thus, the number of inputs to each MAC Layer in the series decreases until a final output is produced.

In the structure 100, 200 disclosed herein, due to the presence of the cells 150, 250 with the selectable layer-specific memory elements 110-1 to 110-$x$, 210-1 to 210-$x$, the MUXs 118, 218 and the THs 170, 270, instead of the outputs of one processing layer in a series of processing layers being fed from one structure to the next they can be fed back into the same structure. For example, in a normal operating mode to complete a first processing layer (Layer 1), analog input voltages for a sample will be supplied to the THs 170, 270 by MUXs 118, 218, the Layer 1 memory elements 110-1, 210-1 within the cells 150, 250 will be selected for operation (i.e., e.g., using first switches 191-1, 291-1 and second switches 192-1, 292-1 connected thereto, as discussed above), and the analog output voltages 189, 289 from the data processing elements 185, 285 will be solutions for the dot product computation performed in Layer 1. The analog output voltages 189, 289 from Layer 1 can be fed back into the structure 100, 200 through the MUXs 118, 218 so that designated THs 170, 270 receive them as analog voltage inputs for the second processing layer (Layer 2), the Layer 2 memory elements 110-2, 210-2 within the cells 150, 250 will be selected for operation (i.e., e.g., using first switches 191-2, 291-2 and second switches 192-2, 292-2 connected thereto, as discussed above), and the next set of analog output voltages 189, 289 from the data processing elements 185, 285 will be solutions for the dot product computation performed in Layer 2. The analog output voltages 189, 289 from Layer 2 can be fed back into the structure 100, 200 through the MUXs 118, 218 so that designated THs 170, 270 receive them as analog voltage inputs for the third processing layer (Layer 3), the Layer 3 memory elements 110-2, 210-2 within the cells 150, 250 will be selected for operation (i.e., e.g., using first switches 191-3, 291-3 and second switches 192-3, 292-3 connected thereto, as discussed above), and the next set of analog output voltages 189, 289 from the data processing elements 185, 285 will be solutions for the dot product computation performed in Layer 3, and so on.

Figure 8A:
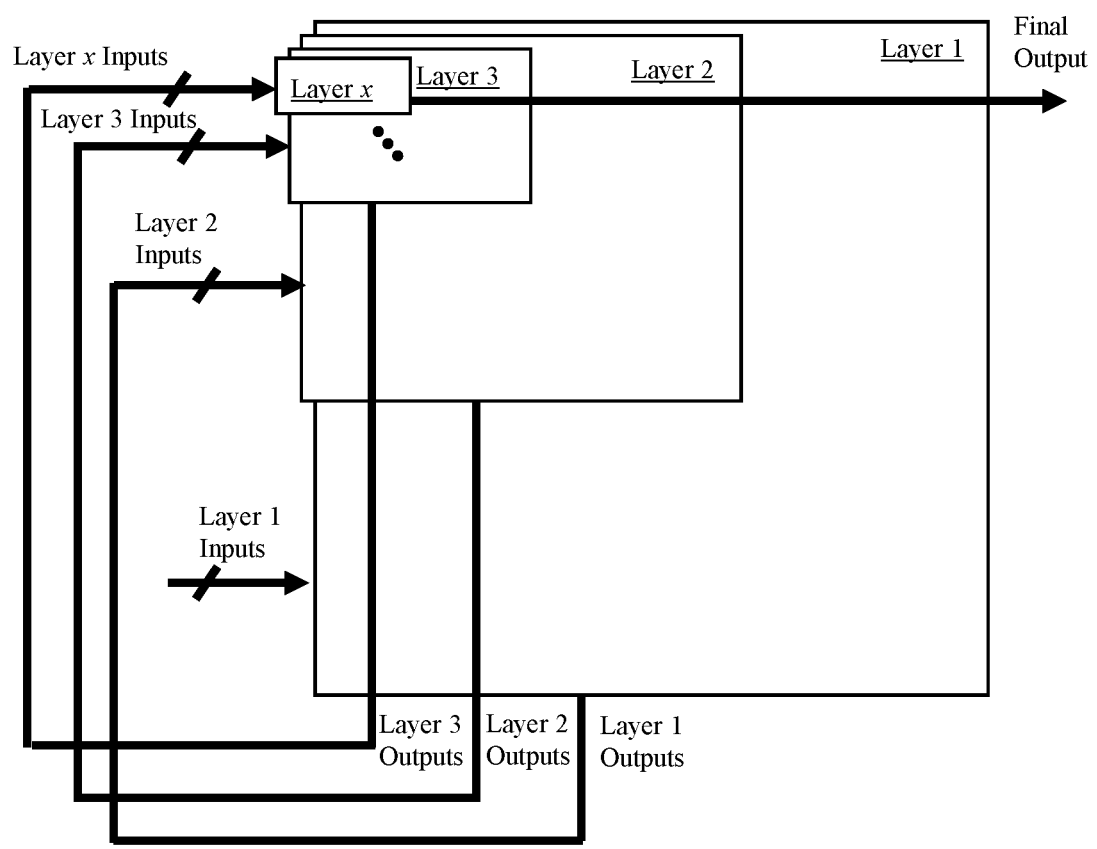
FIGS. 8A-8D are diagrams illustrative of user-defined patterns that can be employed for fabric reuse when feeding outputs from one processing layer in a series of processing layers back into the structure as inputs for the next processing layer in the series.

As mentioned above, typically, with in-memory processing a smaller array is required to complete each successive processing layer in the series. For example, in an illustrative in-memory processing application a first processing layer (Layer 1) could require an array size of 768×300, Layer 2 could require an array size of 300×100, Layer 3 could require an array size of 100×10, and, in this case, the last processing layer (Layer 4) could require an array size of 10×1). Thus, with each successive processing layer, smaller sections of the structure 100, 200 would be operational. Depending upon the size of the structure 100, 200 and, particularly, depending upon the size of the pre-partitioned cell array, these sections can be overlapping sections and the pattern employed for the overlapping sections can be user-defined For example, FIG. 8A is a diagram illustrative of a pattern of overlapping sections of the structure 100, 200 that could be employed for fabric reuse. In this pattern, Layer 1 is performed using the largest section (or all) of a pre-partitioned cell array and starting with the first row. Layer 2 is performed using a section with a fewer number of rows and columns than Layer 1 and starting with the first row. Layer 3 is perform using a section with a fewer number of rows and columns than the Layer 2 and also starting with the first row, and so on.

Figure 8B:
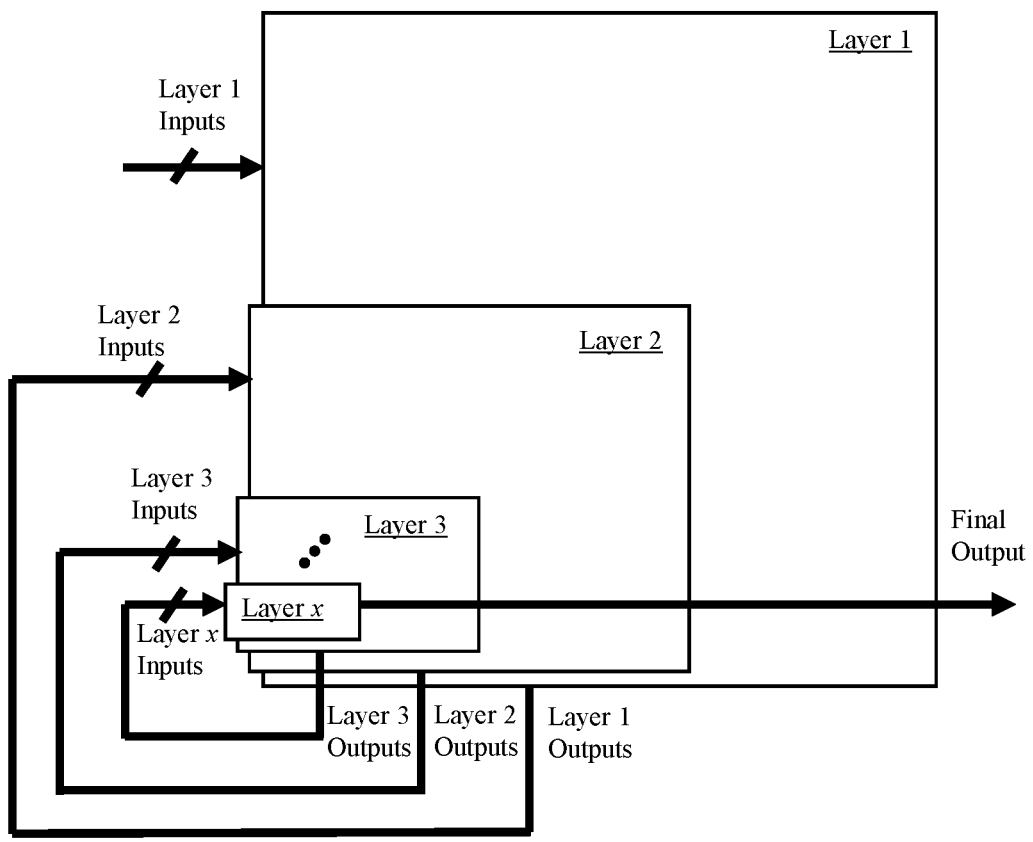

FIG. 8B is a diagram illustrative of another pattern of overlapping sections of the structure 100, 200 that could be employed for fabric reuse. In this pattern, Layer 1 is similarly performed using the largest section (or all) of a pre-partitioned cell array. Layer 2 is performed using a section with a fewer number of rows and columns than Layer 1 and ending with the last row. Layer 3 is perform using a section with a fewer number of rows and columns than the Layer 2 and ending with the last row, and so on.

Figure 8C:
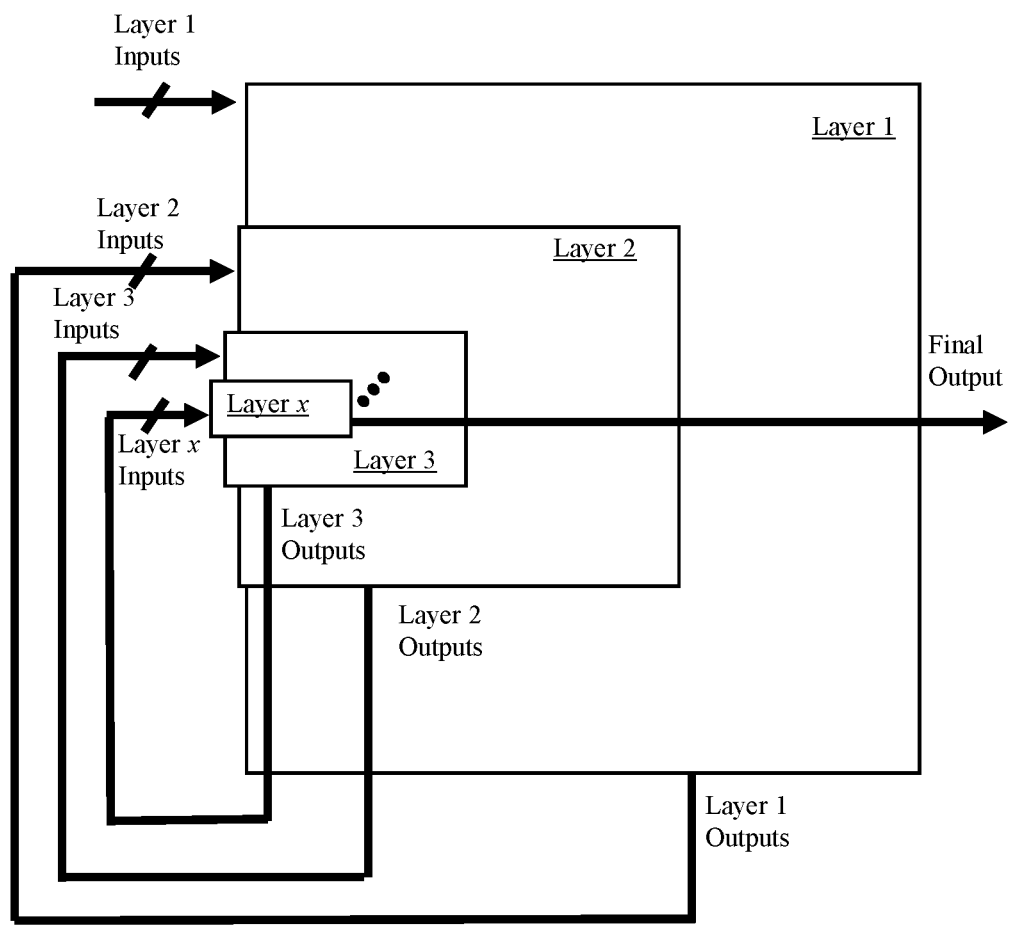

FIG. 8C is a diagram illustrative of yet another pattern of overlapping sections of the structure 100, 200 that could be employed for fabric reuse. In this pattern, Layer 1 is similarly performed using the largest section (or all) of a pre-partitioned cell array. Layer 2 is performed using a section with a fewer number of rows and columns than Layer 1 at the center of the pre-partitioned cell array. Layer 3 is perform using a section with a fewer number of rows and columns than the Layer 2 at the center of the pre-partitioned cell array, and so on.

Figure 8D:
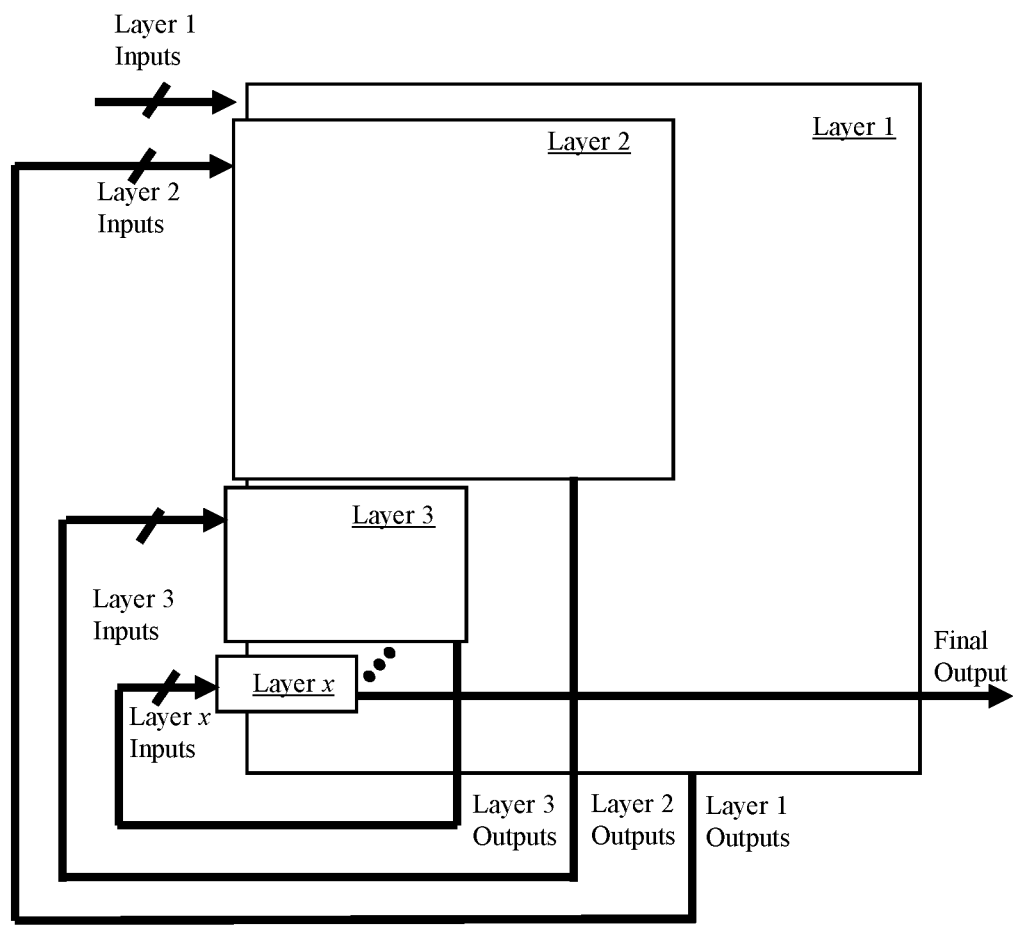

FIG. 8D is a diagram illustrative of yet another pattern of overlapping sections of the structure 100, 200 that could be employed for fabric reuse. In this pattern, Layer 1 is similarly performed using the largest section (or all) of a pre-partitioned cell array. Layer 2 is performed using a section with a fewer number of rows and columns than Layer 1 starting with the first row. Layer 3 is perform using a section with a fewer number of rows and columns than the Layer 2 that is below and not overlapping the section of Layer 2, and so on.

The patterns illustrated in FIGS. 8A-8D are provided for illustration purposes and are not intended to be limiting. Alternatively, any other suitable user-defined pattern could be employed.

Programming of the layer-specific memory elements 110-1 to 110-x and 210-1 and 210-x can be performed prior to in-memory processing based on the user-defined pattern. Thus, for example, all Layer 1 memory elements 110-1, 210-1 in the cells 150, 250 within the section designated for Layer 1 processing will be pre-programmed to store certain weight values needed to complete Layer 1 processing, all Layer 2 memory elements 110-2, 210-2 in the cells 150, 250 within the section designated for Layer 2 processing will be pre-programmed to store certain weight values needed to complete Layer 2 processing, all Layer 3 memory elements 110-3, 210-3 in the cells 150, 250 within the section designated for Layer 3 processing will be pre-programmed to store certain weight values needed to complete Layer 3 processing, and so on. Thus, in the structure 100, 200, in some cells 150, 250, all of the layer-specific memory elements 110-1 to 110-x and 210-1 and 210-x may be pre-programmed to store layer-specific weight values, while in other cells 150, 250 fewer than all of the layer-specific memory elements may be pre-programmed.

To perform fabric reuse during in-memory processing, as described above, the structures disclosed herein (i.e., the structure 100 of FIGS. 1A-1B and the structure 200 of FIGS. 2A-2B) can include additional control and feedback circuitry to pass the analog output voltages 189, 289 associated with one processing layer are fed back (via the MUXs 118, 218) to THs, 170, 270 of appropriate initial memory banks and rows thereof for completion of the next subsequent processing layer. In general, control and feedback circuits are known in the art and, thus, the details thereof have been omitted from this specification in order to allow the reader to focus on the salient aspects of the disclosed embodiments.

The structures disclosed herein (e.g., the structure 100 of FIGS. 1A-1B and the structure 200 of FIGS. 2A-2B) can also include additional circuitry (not shown) to implement other operational modes (e.g., program modes). Specifically, as mentioned above prior to operation of the structure 100, 200 in the normal operational mode (i.e., in the mission mode during which in-memory processing including fabric reuse), the programmable resistors of at least some of memory elements are programmed to particular resistance states. Reprogramming of programmable resistors may also be required as a result of calibration processing (not discussed herein). Depending upon the type of programmable resistors incorporated into the memory elements, different write schemes could be employed to achieve the desired programming/reprogramming (as discussed above with regard to FIGS. 3A-3D, 4A-4B and 5A-5B). Additional circuit components for such write schemes (e.g., for RRAM-type programmable resistors) have been disclosed by the inventors in other concurrently filed U.S. patent applications. However, to allow the reader to focus on the salient aspects of the disclosed embodiments specifically related to fabric reuse and to avoid clutter in the figures, these additional circuit components have been omitted from this disclosure. In any case, it should be understood that in the structure embodiments disclosed herein the programmable resistors of the memory elements 110-1 to 110-x and 210-1 and 210-x within the cells 150, 250 are individually programmable and reprogrammable to desired resistance states.

Additionally, in the structures disclosed herein the memory elements are described and shown in the figures as being single resistor memory elements or dual resistor memory elements. However, it should be understood that the figures and description thereof are not intended to be limiting. Alternatively, the disclosed structures could include memory elements with more than two programmable resistors. In this case, each memory bank would have a corresponding number of bitlines with feedback buffer circuits and each column of memory banks would have additional circuitry (e.g., addition or subtraction circuitry) to combine the current outputs from all bitlines as appropriate depending upon whether the resistance states of the programmable resistor represent positive or negative weight values.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an array of memory banks arranged in rows and columns, wherein each memory bank comprises:
bank input nodes;
a bitline; and
cells, wherein each cell comprises:
a cell input node connected to a corresponding bank input node;
a cell output node connected to the bitline;
switches; and
memory elements,
wherein each memory element comprises a programmable resistor with opposing end terminals connectable by a corresponding pair of the switches to the cell input node and the cell output node, and
wherein each row of the memory banks comprises an initial memory bank further comprising: amplifiers connected between the bank input nodes and the cells; and track-and-hold devices connected to the bank input nodes.

2. The structure of claim 1,
wherein, in each cell, the memory elements are associated with different processing layers of a series of processing layers and the programmable resistor of at least one memory element stores a weight value, and
wherein the structure is controllable so that outputs from one processing layer in the series are fed as inputs to a next processing layer in the series.

3. The structure of claim 1, wherein each memory bank further comprises a feedback buffer circuit connected to the bitline to bias the bitline to a virtual ground voltage.

4. The structure of claim 1,
wherein each track-and-hold device comprises:
an analog voltage terminal;
a track node connected to a bank input node;
a switch connected between the analog voltage terminal and the track node; and
a capacitor connected between the track node and ground,
wherein, in a track mode, the switch of the track-and-hold device connects the analog voltage terminal to the track node and the capacitor stores a stored voltage equal to an analog voltage sampled at the analog voltage terminal, and
wherein, in a hold mode, the switch of the track-and-hold device disconnects the analog voltage terminal from the track node.

5. The structure of claim 4,
wherein each initial memory bank further comprises amplifiers connected between the bank input nodes and the cells, and
wherein each amplifier receives the stored voltage as an input voltage, adds a virtual ground voltage to the input voltage, and outputs a level shifted input voltage equal to a sum of the input voltage and the virtual ground voltage.

6. The structure of claim 4, further comprising:
sets of row interconnect lines interconnecting adjacent memory banks within each row of memory banks and communicating level shifted input voltages output from the amplifiers in the initial memory bank of a row to all other memory banks in the same row; and
voltage buffers integrated into at least some of the memory banks to buffer the level shifted input voltages.

7. The structure of claim 1,
wherein each memory bank further comprises: a bias node on the bitline; a bank output node; and a feedback buffer circuit connected to the bias node and the bank output node,
wherein, within the memory bank, the feedback buffer circuit biases the bias node to a virtual ground voltage and outputs, at the bank output node of the memory bank, a buffered bank-specific output current dependent on a sum of all output currents from all programmable resistors of all selected memory elements in the cells of the memory bank,
wherein the structure further comprises column interconnect lines for the columns, respectively, and
wherein each column interconnect line for each column is connected to all bank output nodes of all memory banks in the column and receives and sums all buffered bank-specific output currents from the bank output nodes.

8. The structure of claim 7, further comprising current-to-voltage converters for the columns, respectively, wherein each current-to-voltage converter for each column is connected to the column interconnect line for the column, receives a column-specific output current from the column interconnect line equal to a sum of the buffered bank-specific output currents and outputs a column-specific analog output voltage dependent on the column-specific output current.

9. The structure of claim 8, wherein the column-specific analog output voltage represents a solution for a dot product computation.

10. The structure of claim 1, wherein the programmable resistor of each memory element comprises any of a resistive random access memory-type resistor, a phase change memory-type resistor, and a magnetic tunnel junction-type resistor.

11. A structure comprising:
an array of memory banks arranged in rows and columns, wherein each memory bank comprises:
bank input nodes;
a first bitline;
a second bitline; and
cells, wherein each cell comprises:
a first cell input node connected to a corresponding bank input node;
a first cell output node connected to the first bitline;
a second cell input node connected to the corresponding bank input node;
a second cell output node connected to the second bitline;
first switches;
second switches; and
memory elements, wherein each memory element comprises:
a first programmable resistor having first opposing end terminals connectable by a first switch to the first cell input node and connected to the first cell output node, respectively; and
a second programmable resistor having second opposing end terminals connected to the second cell input node and connectable by a second switch to the second cell output node, and
wherein each row of the memory banks comprises an initial memory bank comprising: amplifiers connected between the bank input nodes and the cells; and track-and-hold devices connected to the bank input nodes.

12. The structure of claim 11,
wherein, in each cell, the memory elements are associated with different processing layers of a series of processing layers and the first programmable resistor and the second programmable resistor of at least one memory element store, in combination, a weight value, and
wherein the structure is controllable so that outputs from one processing layer in the series are fed as inputs to a next processing layer in the series.

13. The structure of claim 11, wherein each memory bank further comprises: a first feedback buffer circuit connected to the first bitline to bias the first bitline to a virtual ground voltage; and a second feedback buffer circuit connected to the second bitline to bias the second bitline to the virtual ground voltage.

14. The structure of claim 11,
wherein each track-and-hold device comprises:
an analog voltage terminal;
a track node connected to a bank input node;
a switch connected between the analog voltage terminal and the track node; and
a capacitor connected between the track node and ground,
wherein, in a track mode, the switch of the track-and-hold device connects the analog voltage terminal to the track node and the capacitor stores a stored voltage equal to an analog voltage sampled at the analog voltage terminal, and
wherein, in a hold mode, the switch of the track-and-hold device disconnects the analog voltage terminal from the track node.

15. The structure of claim 14, wherein each amplifier receives the stored voltage as an input voltage, adds a virtual ground voltage to the input voltage, and outputs a level shifted input voltage equal to a sum of the input voltage and the virtual ground voltage.

16. The structure of claim 15, further comprising:
sets of row interconnect lines interconnecting adjacent memory banks within each row of memory banks and communicating level shifted input voltages from the amplifiers of the initial memory bank of a row to all other memory banks in the same row; and
voltage buffers integrated into at least some of the memory banks to buffer the level shifted input voltages.

17. The structure of claim 11,
wherein each memory bank further comprises: a first bias node on the first bitline; a first bank output node; a first feedback buffer circuit connected to the first bias node and the first bank output node; a second bias node on the second bitline; a second bank output node; and a second feedback buffer circuit connected to the second bias node and the second bank output node,
wherein, within the memory bank, the first feedback buffer circuit biases the first bias node to a virtual ground voltage and outputs, at the first bank output node, a buffered bank-specific first output current dependent on a sum of all first output currents from all first programmable resistors in the memory bank and the second feedback buffer circuit biases the second bias node to the virtual ground voltage and outputs, at the second bank output node of the memory bank, a buffered bank-specific second output current dependent on a sum of all second output currents from all second programmable resistors in the memory bank,
wherein the structure further comprises pairs of column interconnect lines for the columns, respectively, and
wherein each pair of column interconnect lines for each column comprises:

a first column interconnect line connected to all first bank output nodes of all memory banks in the column, wherein the first column interconnect line receives and sums all buffered bank-specific first output currents from the memory banks in the column; and a second column interconnect line connected to all second bank output nodes of all memory banks in the column, wherein the second column interconnect line receives and sums all buffered bank-specific second output currents from the memory banks in the column.

18. The structure of claim 17, further comprising subtractors for the columns, respectively, wherein each subtractor for each column is connected to the pair of the column interconnect lines for the column, receives, from the first column interconnect line of the pair, a column-specific first output current equal to a sum of the buffered bank-specific first output currents from the memory banks in the column, receives, from the second column interconnect line of the pair, a column-specific second output current equal to a sum of the buffered bank-specific second output currents from the memory banks in the column, and outputs a column-specific analog output voltage based on a difference between the column-specific first output current and the column-specific second output current.

19. The structure of claim 18, wherein the column-specific analog output voltage represents a solution for a dot product computation.

20. The structure of claim 11, wherein the first programmable resistor and the second programmable resistor of each memory element comprise any of resistive random access memory-type resistors, phase change memory-type resistors, and magnetic tunnel junction-type resistors.

* * * * *